(12) United States Patent
Ko et al.

(10) Patent No.: US 12,268,062 B2
(45) Date of Patent: Apr. 1, 2025

(54) DISPLAY PANEL AND DISPLAY DEVICE WITH LIGHT-EMITTING DEVICES OVERLAPPING WINDING AREA

(71) Applicants: Chengdu BOE Optoelectronics Technology Co., Ltd., Chengdu (CN); BOE Technology Group Co., Ltd., Beijing (CN)

(72) Inventors: Youngyik Ko, Beijing (CN); Benlian Wang, Beijing (CN); Weiyun Huang, Beijing (CN); Yue Long, Beijing (CN); Yudiao Cheng, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 1060 days.

(21) Appl. No.: 17/274,259

(22) PCT Filed: May 27, 2020

(86) PCT No.: PCT/CN2020/092731
§ 371 (c)(1),
(2) Date: Mar. 8, 2021

(87) PCT Pub. No.: WO2021/237540
PCT Pub. Date: Dec. 2, 2021

(65) Prior Publication Data
US 2022/0199734 A1 Jun. 23, 2022

(51) Int. Cl.
*H10K 59/131* (2023.01)
*H10K 59/121* (2023.01)
*H01L 27/12* (2006.01)

(52) U.S. Cl.
CPC ....... *H10K 59/131* (2023.02); *H10K 59/1213* (2023.02); *H01L 27/124* (2013.01)

(58) Field of Classification Search
CPC . H10K 59/131; H10K 59/1213; H01L 27/124
See application file for complete search history.

(56) References Cited

U.S. PATENT DOCUMENTS

| 10,403,212 B2 * | 9/2019 | Chen | G09G 3/3225 |
| 10,490,620 B1 * | 11/2019 | Lai | G02F 1/136286 |

(Continued)

FOREIGN PATENT DOCUMENTS

| CN | 110277075 A | 9/2019 |
| CN | 110288943 A | 9/2019 |

(Continued)

OTHER PUBLICATIONS

Chinese OA issued for CN 202080000836.5 issued Jul. 15, 2022.
(Continued)

*Primary Examiner* — Lex H Malsawma
(74) *Attorney, Agent, or Firm* — ArentFox Schiff LLP; Michael Fainberg

(57) ABSTRACT

Some embodiments of the disclosure provide a display panel and a display device. The display panel includes: a display area; a winding area surrounded by the display area; a notch area surrounded by the winding area; a plurality of pixel driving circuits located in the display area; a plurality of light-emitting devices located at sides, facing away from a base substrate, of the pixel driving circuits, each pixel driving circuit being electrically connected to one corresponding light-emitting device; an orthographic projection of at least one of the plurality of light-emitting devices on the base substrate overlaps with the winding area, other light-emitting devices are in the display area; each light-emitting device whose orthographic projection on the base substrate overlaps with the winding area is electrically connected to corresponding pixel driving circuit through a (Continued)

first conducting line, and the first conducting line extends from the display area to the winding area.

16 Claims, 20 Drawing Sheets

(56) References Cited

U.S. PATENT DOCUMENTS

| | | | |
|---|---|---|---|
| 2014/0197428 A1 | 7/2014 | Wang et al. | |
| 2017/0162637 A1 | 6/2017 | Choi et al. | |
| 2018/0190190 A1* | 7/2018 | Xi | G09G 3/3208 |
| 2018/0293936 A1 | 10/2018 | Fujioka | |
| 2020/0135972 A1 | 4/2020 | Ma et al. | |
| 2020/0380915 A1* | 12/2020 | Yoon | G09G 3/3225 |
| 2020/0380917 A1 | 12/2020 | Zhu et al. | |
| 2021/0064087 A1* | 3/2021 | Ma | G06F 1/189 |
| 2021/0065625 A1 | 3/2021 | Wang et al. | |
| 2021/0066409 A1 | 3/2021 | Fan | |
| 2021/0280128 A1 | 9/2021 | Shen et al. | |
| 2021/0351255 A1 | 11/2021 | Chang et al. | |
| 2021/0408145 A1* | 12/2021 | Zhang | H10K 59/131 |

FOREIGN PATENT DOCUMENTS

| | | |
|---|---|---|
| CN | 110379836 A | 10/2019 |
| CN | 110504289 A | 11/2019 |
| CN | 110518037 A | 11/2019 |
| CN | 110767099 A | 2/2020 |
| CN | 110767141 A | 2/2020 |
| CN | 110767159 A | 2/2020 |
| CN | 110874990 A | 3/2020 |
| CN | 110928024 A | 3/2020 |
| CN | 111048573 A | 4/2020 |
| CN | 210245501 U | 4/2020 |
| JP | 2018180110 A | 11/2018 |
| WO | 2019242510 A1 | 12/2019 |

OTHER PUBLICATIONS

ESSR issued for EP 20900715.2 dated Jun. 14, 2022.
Japanese Office Action for JP 2021-564590 issued on Mar. 13, 2024.
European Office Action for EP 20900715.2 issued on Apr. 18, 2024.

* cited by examiner

DISPLAY PANEL AND DISPLAY DEVICE WITH LIGHT- EMITTING DEVICES OVERLAPPING WINDING AREA

This application is a National Stage of International Application No. PCT/CN2020/092731, filed May 27, 2020, which is hereby incorporated by reference in its entirety.

FIELD

Some embodiments of the disclosure relate to the technical field of display, in particular to a display panel and a display device.

BACKGROUND

Organic Light Emitting Diode (OLED), Quantum Dot Light Emitting Diode (QLED), Micro Light Emitting Diode (Micro LED) and other electroluminescent diodes have the advantages of self-illumination and low energy consumption, and are one of the hotspots in the current applied research field of electroluminescent display devices.

SUMMARY

A display panel provided by an embodiment of the disclosure includes:
 a display area;
 a winding area surrounded by the display area;
 a notch area surrounded by the winding area;
 a plurality of pixel driving circuits located in the display area; and
 a plurality of light-emitting devices located at sides, facing away from a base substrate, of the pixel driving circuits, the plurality of pixel driving circuit are electrically connected to the plurality of light-emitting devices in an one-to-one manner;
 wherein an orthographic projection of at least one of the plurality of light-emitting devices on the base substrate overlaps with the winding area, and other light-emitting devices are located in the display area; and
 the light-emitting device whose orthographic projection on the base substrate overlaps with the winding area is electrically connected to a corresponding pixel driving circuit through a first conducting line, and the first conducting line extends from the display area to the winding area.

Optionally, in some embodiments of the disclosure, the display area includes a first area, a second area and a third area which are arranged in a second direction;
 the second area includes a first sub-area and a second sub-area arranged in a first direction; wherein the first sub-area and the second sub-area are separated by the notch area;
 an orthographic projection of each light-emitting device whose orthographic projection on the base substrate overlaps with the winding area in the second direction is located in at least one of the first sub-area and the second sub-area.

Optionally, in some embodiments of the disclosure, the light-emitting devices in the first area and the third area are first light-emitting devices, and regions defined by orthographic projections of light-emitting areas of the first light-emitting devices on the base substrate are approximately equal in area;
 the pixel driving circuits electrically connected to the first light-emitting devices are first pixel driving circuits, and regions defined by orthographic projections of the first pixel driving circuits on the base substrate are approximately equal in area.

Optionally, in some embodiments of the disclosure, the light-emitting device whose orthographic projection on the base substrate overlaps with the winding area is a second light-emitting device, and the pixel driving circuits electrically connected to the second light-emitting devices are second pixel driving circuits;
 an area of regions defined by orthographic projections of light-emitting areas of the second light-emitting devices on the base substrate is larger than an area of regions defined by orthographic projections of light-emitting areas of the first light-emitting devices on the base substrate.

Optionally, in some embodiments of the disclosure, in the first direction and from the notch area to at least one of the first sub-area and the second sub-area, the area of regions defined by orthographic projections of light-emitting areas of the second light-emitting devices on the base substrate decreases successively.

Optionally, in some embodiments of the disclosure, the regions defined by orthographic projections of light-emitting areas of the second light-emitting devices on the base substrate are approximately equal in area.

Optionally, in some embodiments of the disclosure, an area of regions defined by orthographic projections of the second pixel driving circuits on the base substrate is approximately equal to an area of regions defined by orthographic projections of the first pixel driving circuits on the base substrate.

Optionally, in some embodiments of the disclosure, the second pixel driving circuits are located in a same column as the first pixel driving circuits in the first area and the second area.

Optionally, in an embodiment of the disclosure, orthographic projections of the light-emitting areas of the first light-emitting devices on the base substrate have first widths in the first direction, and orthographic projections of the light-emitting areas of the first light-emitting devices on the base substrate have second widths in the second direction;
 orthographic projections of the light-emitting areas of the second light-emitting devices on the base substrate have third widths in the first direction, and orthographic projections of the light-emitting areas of the second light-emitting devices on the base substrate have fourth widths in the second direction;
 the third widths are larger than the first widths, and the second widths are approximately equal to the fourth widths.

Optionally, in some embodiments of the disclosure, the light-emitting devices located in the second area are third light-emitting devices, and the pixel driving circuits electrically connected to the third light-emitting devices are third pixel driving circuits;
 an area of regions defined by orthographic projections of the third pixel driving circuits on the base substrate is approximately equal to the area of regions defined by orthographic projections of the first pixel driving circuits on the base substrate.

Optionally, in some embodiments of the disclosure, the area of regions defined by orthographic projections of light-emitting areas of the third light-emitting devices on the base substrate is smaller than the area of regions defined by orthographic projections of the light-emitting areas of the second light-emitting devices on the base substrate;

in the first direction and from the notch area to at least one of the first sub-area and the second sub-area, the area of regions defined by orthographic projections of the light-emitting areas of the third light-emitting devices on the base substrate decreases successively.

Optionally, in some embodiments of the disclosure, the area of regions defined by orthographic projections of the light-emitting areas of the third light-emitting devices on the base substrate is approximately equal to the area of regions defined by orthographic projections of the light-emitting areas of the second light-emitting devices on the base substrate.

Optionally, in some embodiments of the disclosure, the light-emitting devices whose orthographic projections on the base substrate overlaps with the winding area are second light-emitting devices, and the pixel driving circuits electrically connected with the second light-emitting devices are second pixel driving circuits;

a distribution density of the second pixel driving circuits is larger than a distribution density of the first pixel driving circuits.

Optionally, in some embodiments of the disclosure, the area of regions defined by orthographic projections of the second pixel driving circuits on the base substrate is smaller than the area of regions defined by orthographic projections of the first pixel driving circuits on the base substrate.

Optionally, in some embodiments of the disclosure, in the first direction and from the notch area to at least one of the first sub-area and the second sub-area, the area of regions defined by orthographic projections of the second pixel driving circuits on the base substrate increases successively.

Optionally, in some embodiments of the disclosure, the regions defined by orthographic projections of the second pixel driving circuits on the base substrate are approximately equal in area.

Optionally, in some embodiments of the disclosure, a quantity of transistors in the second pixel driving circuit is smaller than a quantity of transistors in the first pixel driving circuit.

Optionally, in some embodiments of the disclosure, the area of regions defined by orthographic projections of the light-emitting areas of the second light-emitting devices on the base substrate is approximately equal to the area of regions defined by orthographic projections of the light-emitting areas of the first light-emitting devices on the base substrate.

Optionally, in some embodiments of the disclosure, the second light-emitting devices in the second area are located in a same column as the first light-emitting devices in the first area and the second area.

Optionally, in some embodiments of the disclosure, the light-emitting devices located in the second area are third light-emitting devices, and the pixel driving circuits electrically connected with the third light-emitting devices are third pixel driving circuits;

orthographic projections of light-emitting areas of the third light-emitting devices on the base substrate are smaller than or approximately equal to the orthographic projections of the light-emitting areas of the first light-emitting devices on the base substrate.

Optionally, in some embodiments of the disclosure, in the first direction and from the notch area to at least one of the first sub-area and the second sub-area, the area of regions defined by orthographic projections of the third pixel driving circuits on the base substrate decreases successively.

Optionally, in some embodiments of the disclosure, for at least one third light-emitting device adjacent to the second light-emitting devices, the at least one third light-emitting device is electrically connected to a corresponding third pixel driving circuit through a second conducting line.

Optionally, in some embodiments of the disclosure, the display panel further includes a plurality of scanning lines; wherein one row of pixel driving circuits is electrically connected to at least one scanning line;

at least one of the first conducting line and the second conducting line are located on a layer same as a layer on which the scanning lines are, and at least one of the first conducting line and the second conducting line are arranged with and the scanning lines in a spaced manner, and at least one of the first conducting line and the second conducting line is made of a material same as a material of which the scanning lines are made.

A display device provided by some embodiments of the disclosure includes the display panel.

DETAILED DESCRIPTION OF THE EMBODIMENTS

Figure 1:
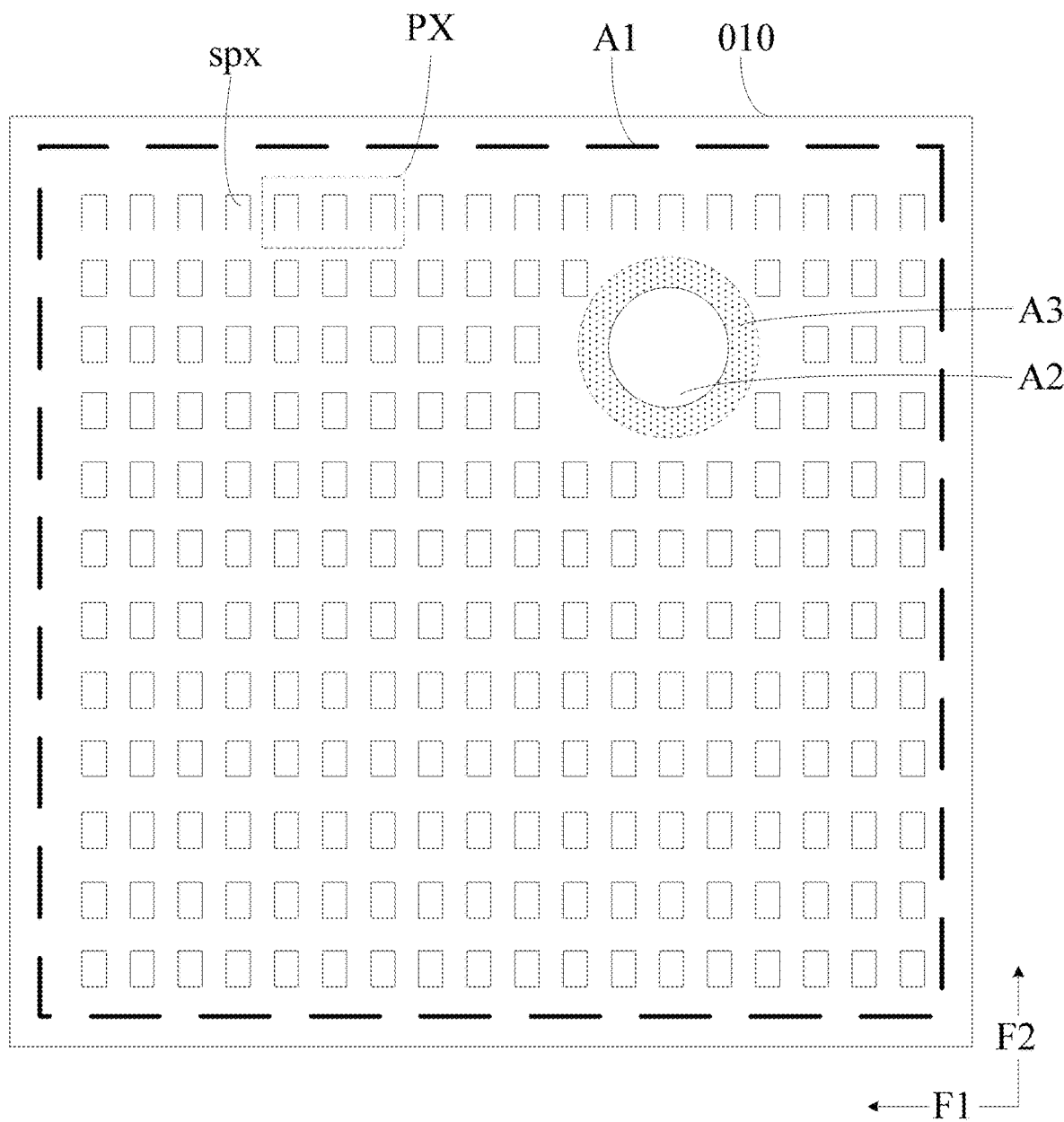
FIG. 1 is a structural schematic diagram of some display panels provided by some embodiments of the disclosure.

In order to make the purpose, technical solution and advantages of some embodiments of the disclosure clearer, the technical solution of some embodiments of the disclosure will be described clearly and completely with reference to the drawings of some embodiments of the disclosure. Obviously, the described embodiments are only part of some embodiments of the disclosure, not all of some embodiments. Besides, some embodiments in the disclosure and the features in some embodiments may be combined with each other without conflict. Based on some embodiments described in the disclosure, all other embodiments obtained by those of ordinary skill in the art without creative labor are within the scope of protection of the disclosure.

Unless otherwise defined, technical terms or scientific terms used in the disclosure shall have the ordinary meaning understood by those with ordinary skills in the field to which the disclosure belongs. The words "first", "second" and the like used in the disclosure do not indicate any order, quantity or importance, but are only used to distinguish different components. Words like "including" or "include" mean that the elements or articles appearing before the words cover the elements or articles listed after the words and their equivalents, and do not exclude other elements or articles. Words like "connection" or "connected" are not limited to physical or mechanical connection, but may include electrical connection, whether direct or indirect.

It should be noted that the sizes and shapes of the figures in the drawings do not reflect true proportions, and are only for the purpose of schematically illustrating the disclosure. The same or similar reference numerals refer to the same or similar elements or elements having the same or similar functions throughout.

With the development of display technology, full screen display has attracted wide attention for its larger screen-to-body ratio and ultra-narrow bezel, and can greatly improve the visual effect of a viewer compared with ordinary display screens. Generally, in a display device such as a mobile phone which adopts a full screen, a front-facing camera, a receiver and the like are usually arranged on the front of the display device to realize self-timer and call functions. A display panel is generally internally provided with a notch area A2 for arranging devices like the front-facing camera and the receiver. However, due to the existence of the notch area A2, a scanning line and a data line need to be wound around the notch area A2, which leads to coupling effect between the scanning line and the data line, causing signal interference and affecting the display effect.

In view of this, an embodiment of the disclosure provides a display panel, which can reduce the coupling effect between the scanning line and the data line, reduce signal interference and improve the display effect.

As shown in FIG. 1, the display panel provided by some embodiments of the disclosure may include a notch area A2, a display area A1 and a winding area A3. The display area A1 surrounds the winding area A3, and the winding area A3 surrounds the notch area A2. In some embodiments, the display panel may also include a base substrate, and the base substrate 1000 may be a glass substrate, a flexible substrate, a silicon substrate, etc., which is not limited here. When the display panel is applied to a display device, devices such as a camera and a receiver are generally provided. The notch area A2 may be a hollowed-out area of the base substrate 1000 in order to arrange the devices such as the camera and the receiver. For example, in an actual preparation process, a position, corresponding to the notch area A2, in the base substrate 1000 is cut to become a hollowed-out area for the arrangement of the devices such as the camera and the receiver in the display device. Alternatively, instead of cutting the base substrate 1000, the position corresponding to the notch area A2 is made to be a transparent area through the avoiding of wires on the base substrate 1000, so that the notch area A2 is formed.

In practical applications, the display panel may also include a bezel area surrounding the display area A1. Elements such as an electrostatic discharge circuit and a gate driving circuit can be arranged in the bezel area. Of course, the display panel may not be provided with a bezel area. This can be determined according to the requirements of the actual application environment, and is not limited here.

In some embodiments of the disclosure, as shown in FIG. 1, the display area A1 may also include a plurality of pixel units PX, wherein each pixel unit PX may include a plurality of sub-pixels spx. In some embodiments, as shown in FIG. 1 and FIG. 2A, each sub-pixel spx may include a pixel driving circuit 0121 and a light-emitting device 0120, wherein the pixel driving circuit 0121 is provided with a transistor and a capacitor, and generates an electrical signal through the interaction between the transistor and the capacitor, and the generated electrical signal is input to a first light-emitting electrode of the light-emitting device 0120; and by applying a corresponding voltage to a second light-emitting electrode of the light-emitting device 0120, the light-emitting device 0120 can be driven to emit light.

Figure 2A:
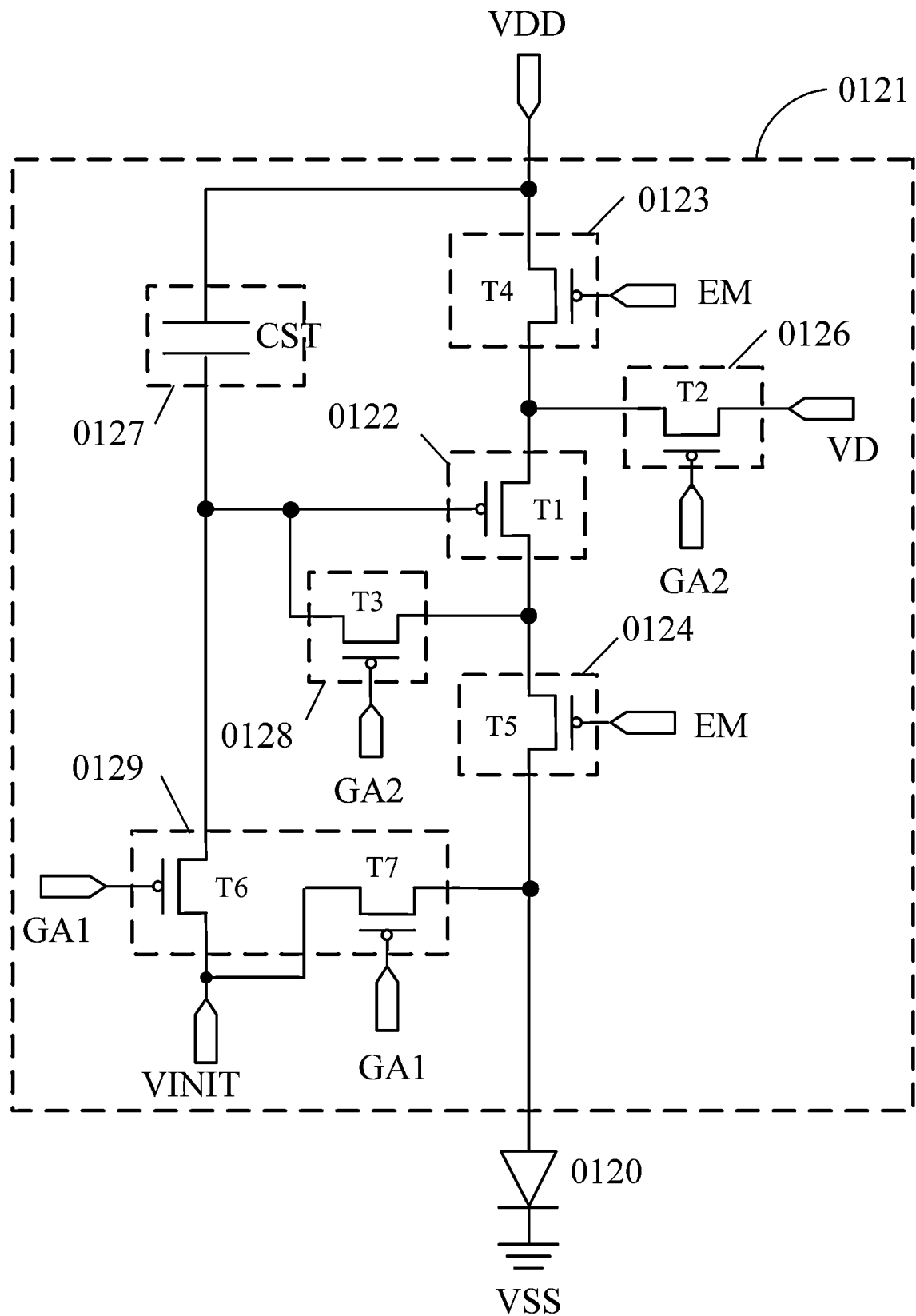
FIG. 2A is a structural schematic diagram of some pixel driving circuits provided by some embodiments of the disclosure.

As shown in FIG. 2A, the pixel driving circuit 0121 may include a drive control circuit 0122, a first light emission control circuit 0123, a second light emission control circuit 0124, a data writing circuit 0126, a storage circuit 0127, a threshold compensation circuit 0128 and a reset circuit 0129.

The drive control circuit 0122 may include a control terminal, a first terminal and a second terminal. The drive control circuit 0122 is configured to provide a driving current for the light-emitting device 0120 for driving the light-emitting device 0120 to emit light. For example, the first light emission control circuit 0123 is connected to the first terminal of the drive control circuit 0122 and a first power supply terminal VDD. The first light emission control circuit 0123 is configured to enable or disable the connection between the drive control circuit 0122 and the first power supply terminal VDD.

The second light emission control circuit 0124 is electrically connected to the second terminal of the drive control circuit 0122 and a first electrode of the light-emitting device 0120. The second light emission control circuit 0124 is configured to enable or disable the connection between the drive control circuit 0122 and the light-emitting device 0120.

The data writing circuit 0126 is electrically connected to the first terminal of the drive control circuit 0122. The data writing circuit 0126 is configured to write a signal on a data line VD into the storage circuit 0127 under the control of a signal on a scanning line GA2.

The storage circuit 0127 is electrically connected to the control terminal of the drive control circuit 0122 and the first power supply terminal VDD. The storage circuit 0127 is configured to store data signals.

The threshold compensation circuit 0128 is electrically connected to the control terminal and the second terminal of the drive control circuit 0122. The threshold compensation circuit 0128 is configured to perform threshold compensation on the drive control circuit 0122.

The reset circuit 0129 is electrically connected to the control terminal of the drive control circuit 0122 and the first electrode of the light-emitting device 0120. The reset circuit 0129 is configured to reset the control terminal of the drive control circuit 0122 and the first electrode of the light-emitting device 0120 under the control of a signal on a gate line GA1.

The light-emitting device 0120 may be an electroluminescent diode, such as at least one of OLED and QLED. The light-emitting device 0120 may include a first electrode, a light-emitting functional layer and a second electrode which are arranged in a stacked manner. In some embodiments, the first electrode may be an anode and the second electrode may be a cathode. The light-emitting functional layer may include a light-emitting layer. Further, the light-emitting functional layer may also include a hole injection layer, a hole transport layer, a light-emitting layer, an electron transport layer, an electron injection layer and other film layers. Of course, in practical applications, the light-emitting device 0120 may be designed and determined according to the requirements of the practical application environment, which is not limited here.

In some embodiments, as shown in FIG. 2A, the drive control circuit 0122 includes a driving transistor T1, the control terminal of the drive control circuit 0122 includes a gate of the driving transistor T1, the first terminal of the drive control circuit 0122 includes a first electrode of the driving transistor T1, and the second terminal of the drive control circuit 0122 includes a second electrode of the driving transistor T1.

In some embodiments, as shown in FIG. 2A, the data writing circuit 0126 includes a data writing transistor T2. The storage circuit 0127 includes a storage capacitor CST. The threshold compensation circuit 0128 includes a threshold compensation transistor T3. The first light emission control circuit 0123 includes a first light emission control transistor T4. The second light emission control circuit 0124 includes a second light emission control transistor T5. The reset circuit 0129 includes a first reset transistor T6 and a second reset transistor T7.

Optionally, a first electrode of the data writing transistor T2 is electrically connected to the first electrode of the driving transistor T1, a second electrode of the data writing transistor T2 is configured to be electrically connected to the data line VD to receive a data signal, and a gate of the data writing transistor T2 is configured to be electrically connected to a second scanning line GA2 to receive a scanning signal.

A first electrode of the storage capacitor CST is electrically connected to a first power supply terminal VDD, and a second electrode of the storage capacitor CST is electrically connected to the gate of the driving transistor T1.

A first electrode of the threshold compensation transistor T3 is electrically connected to the second electrode of the driving transistor T1, a second electrode of the threshold compensation transistor T3 is electrically connected to the gate of the driving transistor T1, and a gate of the threshold compensation transistor T3 is configured to be electrically connected to the second scanning line GA2 to receive a scanning signal.

A first electrode of the first reset transistor T6 is configured to be electrically connected to a reset signal line VINIT to receive a first reset signal, a second electrode of the first reset transistor T6 is electrically connected to the gate of the driving transistor T1, and a gate of the first reset transistor T6 is configured to be electrically connected to a first scanning line GA1 to receive a control signal.

A first electrode of the second reset transistor T7 is configured to be electrically connected to the reset signal line VINIT to receive a second reset signal, a second electrode of the second reset transistor T7 is electrically connected to the first electrode of the light-emitting device 0120, and a gate of the second reset transistor T7 is configured to be electrically connected to the first scanning line GA1 to receive a control signal.

A first electrode of the first light emission control transistor T4 is electrically connected to the first power supply terminal VDD, a second electrode of the first light emission control transistor T4 is electrically connected to the first electrode of the driving transistor T1, and a gate of the first light emission control transistor T4 is configured to be electrically connected to a light emission control line EM to receive a light emission control signal.

A first electrode of the second light emission control transistor T5 is electrically connected to the second electrode of the driving transistor T1, a second electrode of the second light emission control transistor T5 is electrically connected to the first electrode of the light-emitting device 0120, and a gate of the second light emission control transistor T5 is configured to be electrically connected to the light emission control line EM to receive a light emission control signal.

A second electrode of the light-emitting device 0120 is electrically connected to a second power supply terminal VSS. The first electrodes and the second electrodes of the above transistors can be determined as sources or drains according to specific applications, which is not limited here.

In some embodiments, the threshold compensation transistor T3 may be of a double-gate structure. One of the first power supply terminal VDD and the second power supply terminal VSS is a high voltage terminal and the other is a low voltage terminal. For example, in some embodiments shown in FIG. 2A, the first power supply terminal VDD is a voltage source which outputs a constant first voltage, and the first voltage is a positive voltage; and the second power supply terminal VSS may be a voltage source which outputs a constant second voltage, and the second voltage is a negative voltage, etc. For example, in some examples, the second power supply terminal VSS may be grounded.

Figure 2B:
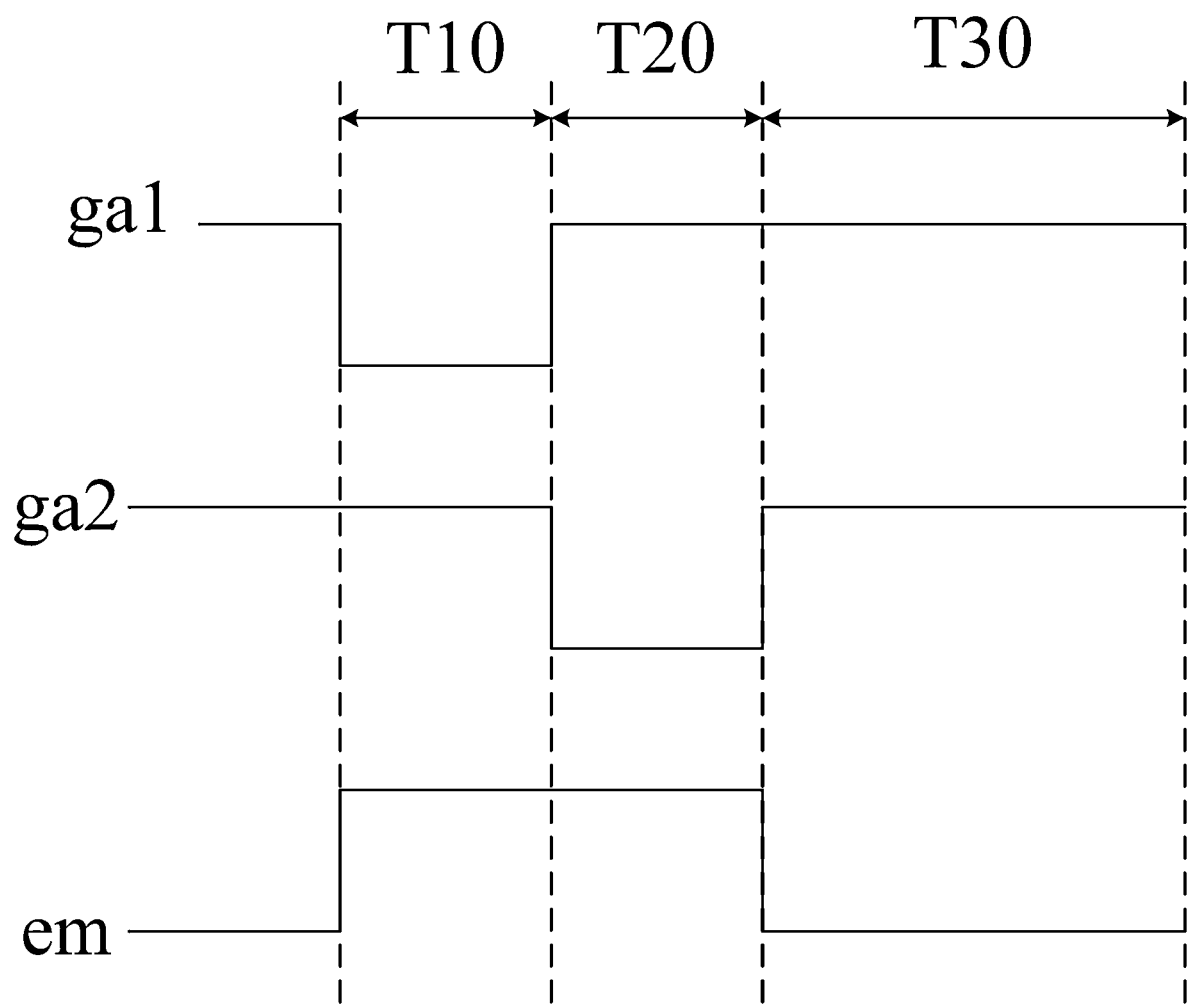
FIG. 2B is a timing diagram of some signals provided by some embodiments of the disclosure.

A signal timing diagram corresponding to the pixel driving circuit shown in FIG. 2A is shown in FIG. 2B. In a frame of display time, the working process of the pixel driving circuit has three stages: T10 stage, T20 stage and T30 stage. In FIG. 2B, ga1 represents a signal transmitted on the first scanning line GA1, ga2 represents a signal transmitted on the second scanning line GA2, and em represents a signal transmitted on the light emission control line EM.

At stage T10, the signal ga1 controls the first reset transistor T6 and the second reset transistor T7 to be turned on. The turned-on first reset transistor T6 supplies a signal transmitted on the reset signal line VINIT to the gate of the driving transistor T1 so as to reset the gate of the driving transistor T1. The turned-on second reset transistor T7 supplies the signal transmitted on the reset signal line VINIT to the first electrode of the light-emitting device 0120 so as to reset the first electrode of the light-emitting device 0120. At this stage, the signal ga2 controls both the data writing transistor T2 and the threshold compensation transistor T3 to be turned off. The signal em controls both the first light emission control transistor T4 and the second light emission control transistor T5 to be turned off.

At stage T20, the signal ga2 controls both the data writing transistor T2 and the threshold compensation transistor T3 to be turned on, so that the data signal transmitted on the data line VD can charge the gate of the driving transistor T1, making the voltage of the gate of the driving transistor T1 become Vdata+|Vth|, wherein Vth represents the threshold voltage of the driving transistor T1 and Vdata represents the voltage of the data signal. At this stage, the signal ga1 controls both the first reset transistor T6 and the second reset transistor T7 to be turned off. The signal em controls both the first light emission control transistor T4 and the second light emission control transistor T5 to be turned off.

At stage T30, the signal em controls both the first light emission control transistor T4 and the second light emission control transistor T5 to be turned on. The turned-on first light emission control transistor T4 supplies the voltage Vdd of the first power supply terminal VDD to the first electrode of the driving transistor T1, so that the voltage of the first electrode of the driving transistor T1 is Vdd. According to the gate voltage Vdata+|Vth| and the voltage Vdd of the first electrode, the driving transistor T1 generates a driving current. This driving current is supplied to the light-emitting device 0120 through the turned-on second light-emitting control transistor T5 to drive the light-emitting device 0120 to emit light. At this stage, the signal ga1 controls both the first reset transistor T6 and the second reset transistor T7 to be turned off. The signal ga2 controls both the data write transistor T2 and the threshold compensation transistor T3 to be turned off.

It should be noted that, in some embodiments of the disclosure, the pixel driving circuit in the sub-pixel may be of a structure including other numbers of transistors in addition to the structure shown in FIG. 2A, which is not limited by some embodiments of the disclosure.

Figure 3:
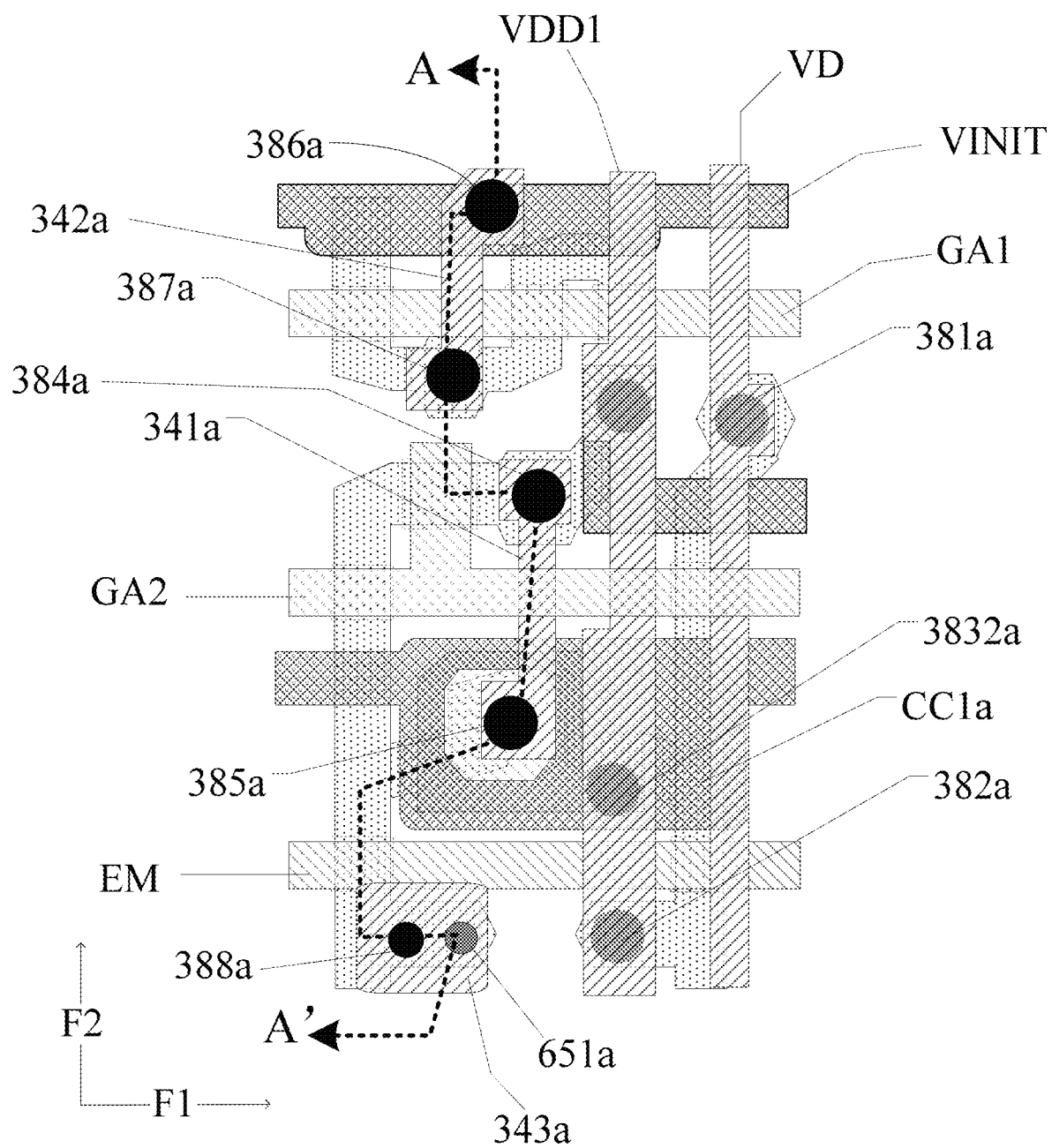
FIG. 3 is a schematic diagram of the layout structure of some pixel driving circuits provided by some embodiments of the disclosure.

FIG. 3 is a schematic diagram of the layout structure of a pixel driving circuit provided by some embodiments of the disclosure. FIGS. 4A to 4D are schematic diagrams of various layers of a pixel driving circuit provided by some embodiments of the disclosure. FIGS. 3 to 4D take the pixel driving circuit of one sub-pixel spx as an example. FIGS. 3 to 4D also show the first scanning line GA1, the second scanning line GA2, the reset signal line VINIT, the light emission control line EM, the data line VD and a power line VDD1 electrically connected to the pixel driving circuit 0121. A driving voltage (i.e., a first voltage) is input to the first power supply terminal VDD through the power line VDD1. In some embodiments, a plurality of data lines VD may be arranged in a first direction F1.

Figure 4A:
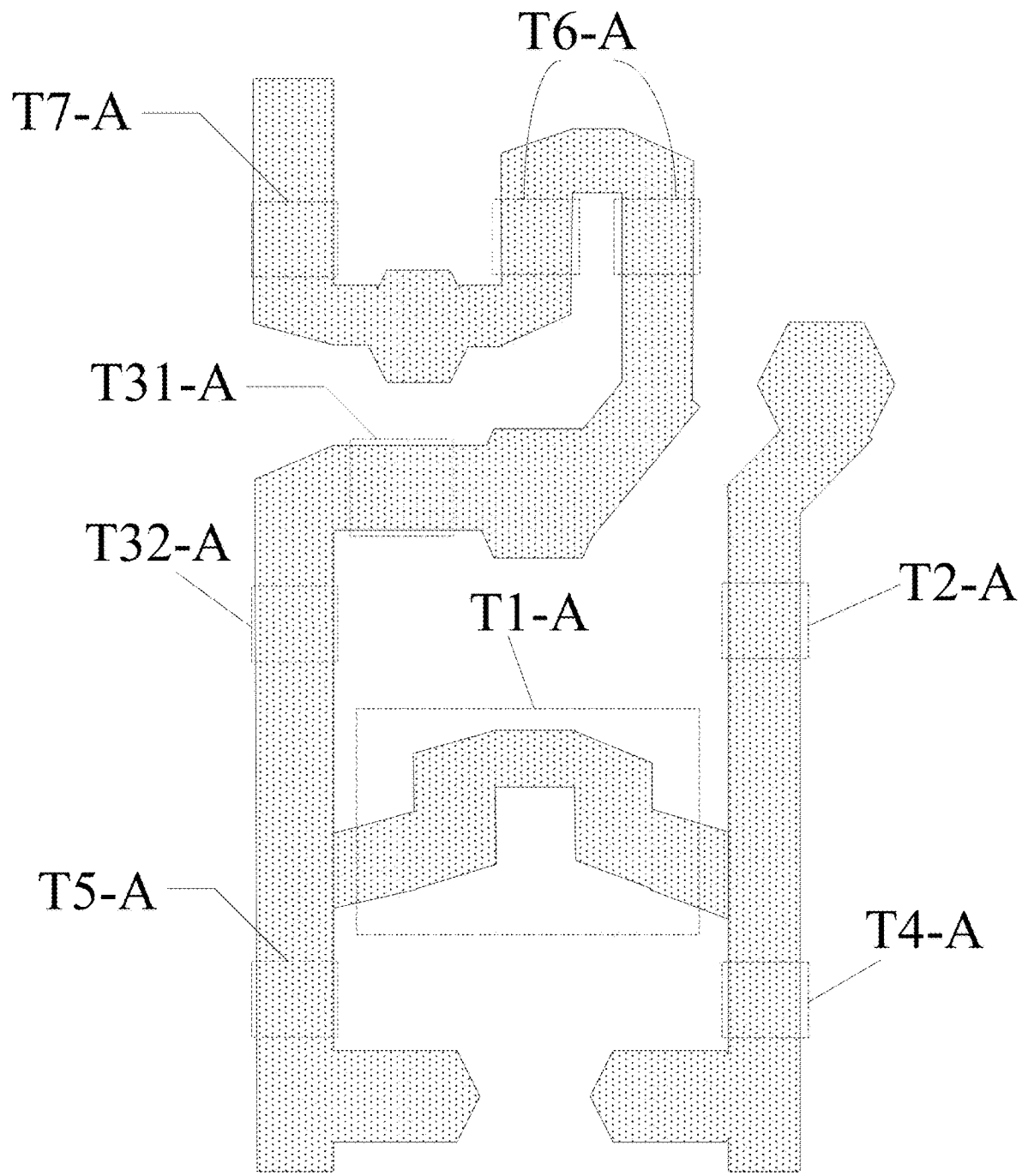
FIG. 4A is a schematic diagram of the layout structure of some semiconductor layers provided by some embodiments of the disclosure.
Figure 5:
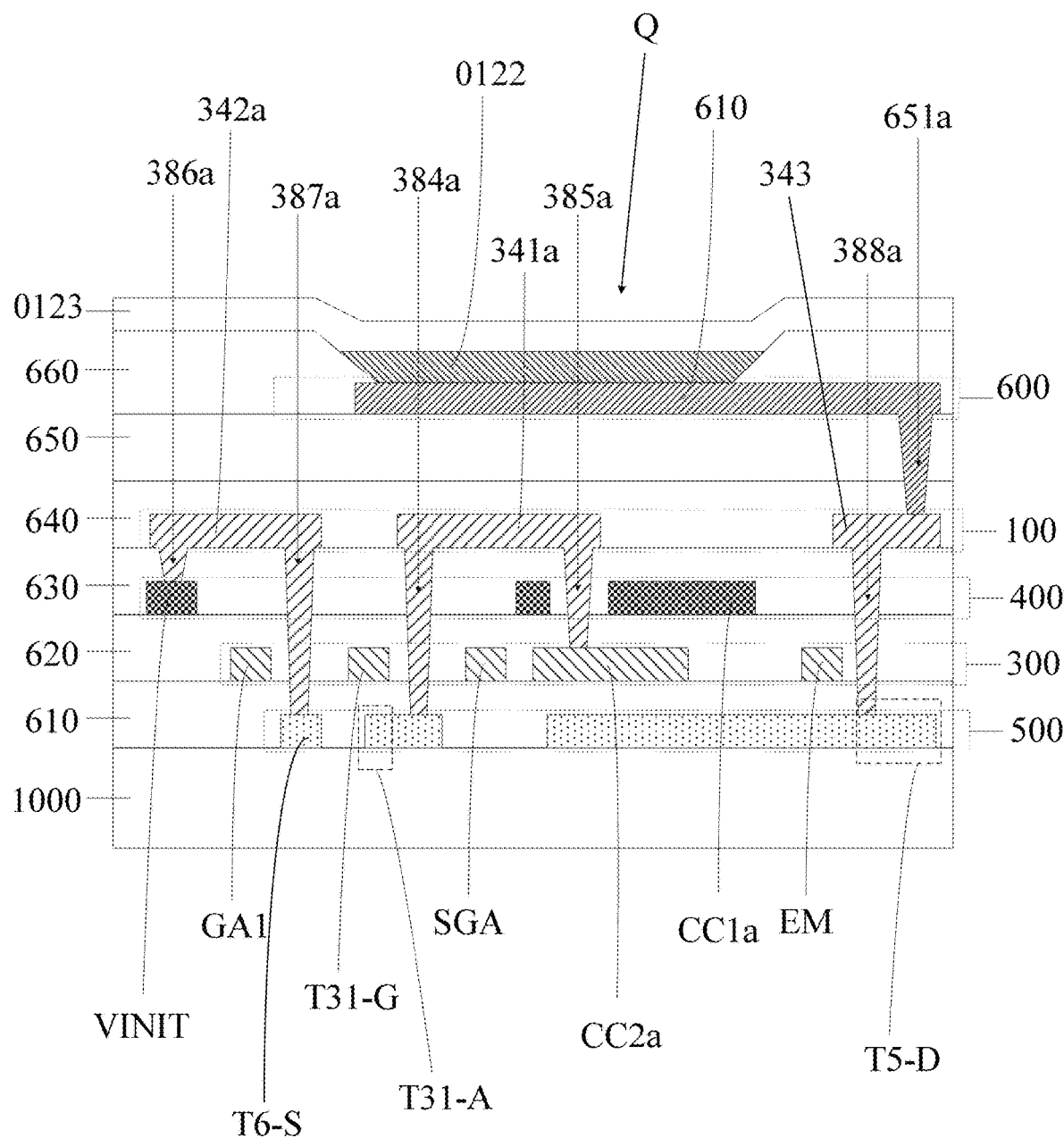
FIG. 5 is a cross-sectional structural schematic diagram in the AA' direction of the schematic diagram of the layout structure in FIG. 3.

In some embodiments, as shown in FIGS. 3, 4A and 5, a semiconductor layer 500 of the pixel driving circuit 0121 is shown. The semiconductor layer 500 may be patterned using a semiconductor material. The semiconductor layer 500 can be used to fabricate the active layers of the above-mentioned driving transistor T1, data writing transistor T2, threshold compensation transistor T3, first light emission control transistor T4, second light emission control transistor T5, first reset transistor T6 and second reset transistor T7, and each active layer may include a source region, a drain region and a channel area between the source region and the drain region. For example, FIG. 4A shows a channel area T1-A of the driving transistor T1, a channel area T2-A of the data writing transistor T2, two channel areas T31-A and T32-A of the threshold compensation transistor T3, a channel area T4-A of the first light emission control transistor T4, a channel area T5-A of the second light emission control transistor T5, a channel area T6-A of the first reset transistor T6 and a channel area T7-A of the second reset transistor T7.

Moreover, in some embodiments, the active layers of all the transistors may be integrated. Further, the semiconductor layer 500 may be made of amorphous silicon, polysilicon, oxide semiconductor materials, and the like. It should be noted that the source region and the drain region may be areas doped with n-type impurities or p-type impurities.

Figure 4B:
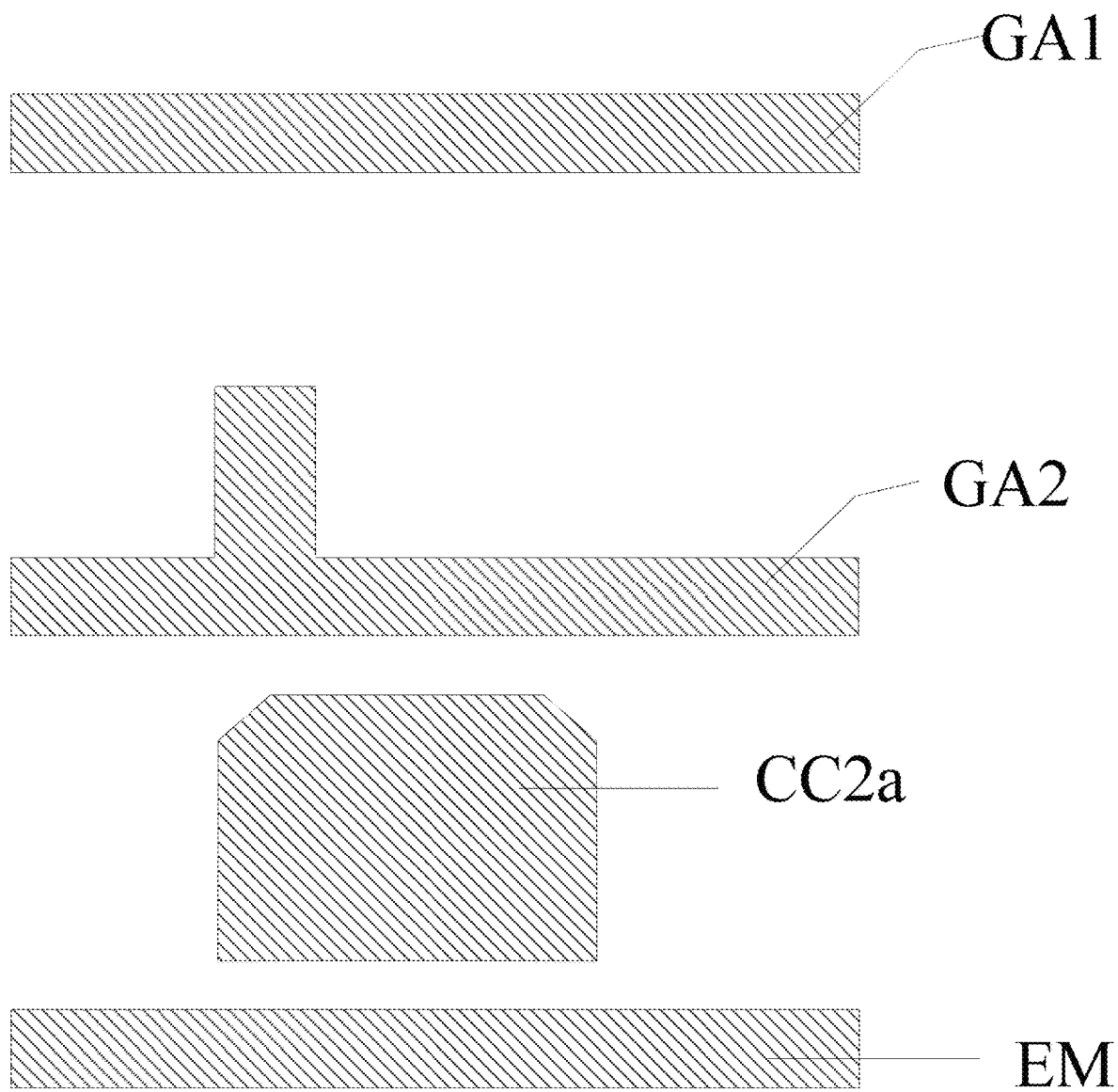
FIG. 4B is a schematic diagram of the layout structure of some gate conductive layers provided by some embodiments of the disclosure.

In some embodiments, as shown in FIG. 5, a first gate insulating layer 610 is formed on the semiconductor layer 500 for protecting the semiconductor layer 500. As shown in FIGS. 3, 4B and 5, a gate conductive layer 300 of the pixel driving circuit 0121 is shown. The gate conductive layer 300 is disposed on the side, facing away from the base substrate 1000, of the first gate insulating layer 610, thereby being insulated from the semiconductor layer 500. The gate conductive layer 300 may include a plurality of scanning lines, a second electrode CC2a of the storage capacitor CST, a plurality of light emission control lines EM, and the gates of the driving transistor T1, the data writing transistor T2, the threshold compensation transistor T3, the first light emission control transistor T4, the second light emission control transistor T5, the first reset transistor T6 and the second reset transistor T7. In some embodiments, the plurality of scanning lines include, for example, a plurality of first gate lines GA1 and a plurality of second gate lines GA2.

For example, as shown in FIGS. 3 to 4B, the gate of the data writing transistor T2 may be a first part where the second scanning line GA2 overlaps with the semiconductor layer 500 (for example, a first part where the second scanning line GA2 overlaps with the channel area T2-A of the data writing transistor T2), the gate of the first light emission control transistor T4 may be a first part where the light emission control line EM overlaps with the semiconductor layer 500, and the gate of the second light emission control transistor T5 may be a second part where the light emission control line EM overlaps with the semiconductor layer 500; the gate of the first reset transistor T6 is a first part where the first scanning line GA1 overlaps with the semiconductor layer 500, the gate of the second reset transistor T7 is a second part where the first scanning line GA1 overlaps with the semiconductor layer 500, and the threshold compensation transistor T3 may be a thin film transistor of a double-gate structure; and one gate of the threshold compensation transistor T3 may be a second part where the second scanning line GA2 overlaps with the semiconductor layer 500 (for example, a second part where the second scanning line GA2 overlaps with the channel area T32-A), and the other gate of the threshold compensation transistor T3 may be a part where a portion protruding from the second scanning line GA2 overlaps with the semiconductor layer 500. In some embodiments, the gate of the driving transistor T1 may be set as a second electrode CC2a of the storage capacitor CST. It can also be said that the gate of the driving transistor T1 and the second electrode CC2a of the storage capacitor CST are integrated.

It should be noted that the dotted rectangular boxes in FIG. 4A show the overlapping parts of the gate conductive layer 300 and the semiconductor layer 500 in the sub-pixel spx.

In some embodiments, as shown in FIGS. 3 and 4B, the first scanning line GA1, the second scanning line GA2 and the light emission control line EM are arranged in the second direction F2, and an orthographic projection of the second scanning line GA2 on the base substrate 1000 is located between an orthographic projection of the first scanning line GA1 on the base substrate 1000 and an orthographic projection of the light emission control line EM on the base substrate 1000.

In some embodiments, as shown in FIGS. 3 and 4B, in the second direction F2, an orthographic projection of the second electrode CC2a of the storage capacitor CST on the base substrate 1000 is located between the orthographic projection of the second scanning line GA2 on the base substrate 1000 and the orthographic projection of the light emission control line EM on the base substrate 1000. An orthographic projection of the portion protruding from the second scanning line GA2 on the base substrate 1000 is located on the side, far away from the orthographic projection of the light emission control line EM on the base substrate 1000, of the orthographic projection of the second scanning line GA2 on the base substrate 1000.

In some embodiments, as shown in FIGS. 3 and 4B, in the second direction F2, the gates of the data writing transistor T2, the threshold compensation transistor T3, the first reset transistor T6 and the second reset transistor T7 are all located on a first side of the gate of the driving transistor T1, and the gates of the first light emission control transistor T4 and the second light emission control transistor T5 are both located on a second side of the gate of the driving transistor T1.

For example, in some embodiments, as shown in FIGS. 3 and 4B, in the first direction F1, the gates of the data writing transistor T2 and the first light emission control transistor T4 are both located on a third side of the gate of the driving transistor T1, and a first gate of the threshold compensation transistor T3, the gate of the second light emission control transistor T5 and the gate of the second reset transistor T7 are all located on a fourth side of the gate of the driving transistor T1. The third side and the fourth side of the gate of the driving transistor T1 are opposite sides of the gate of the driving transistor T1 in the first direction F1.

Figure 4C:
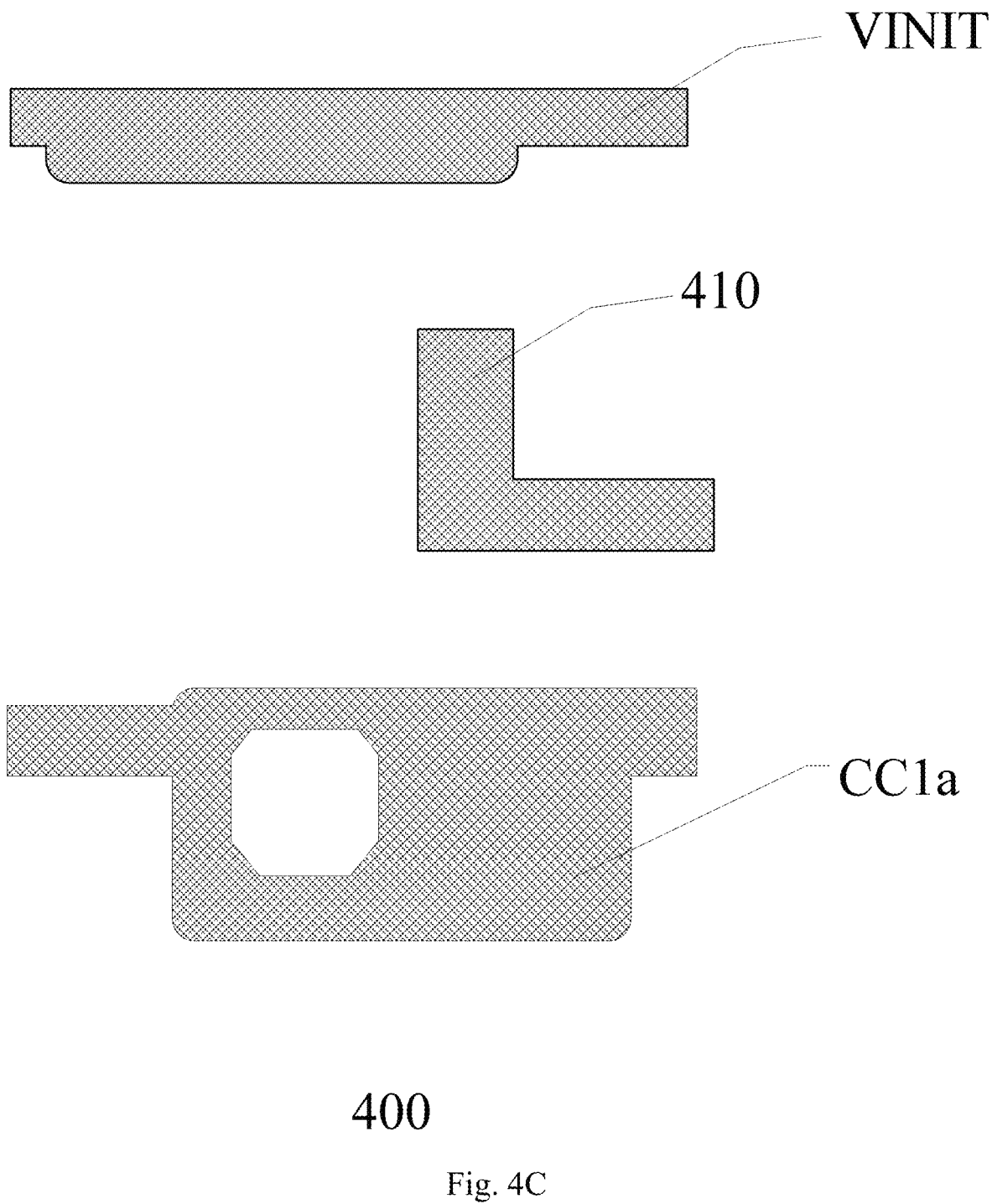
FIG. 4C is a schematic diagram of the layout structure of some capacitor electrode layers provided by some embodiments of the disclosure.
Figure 4D:
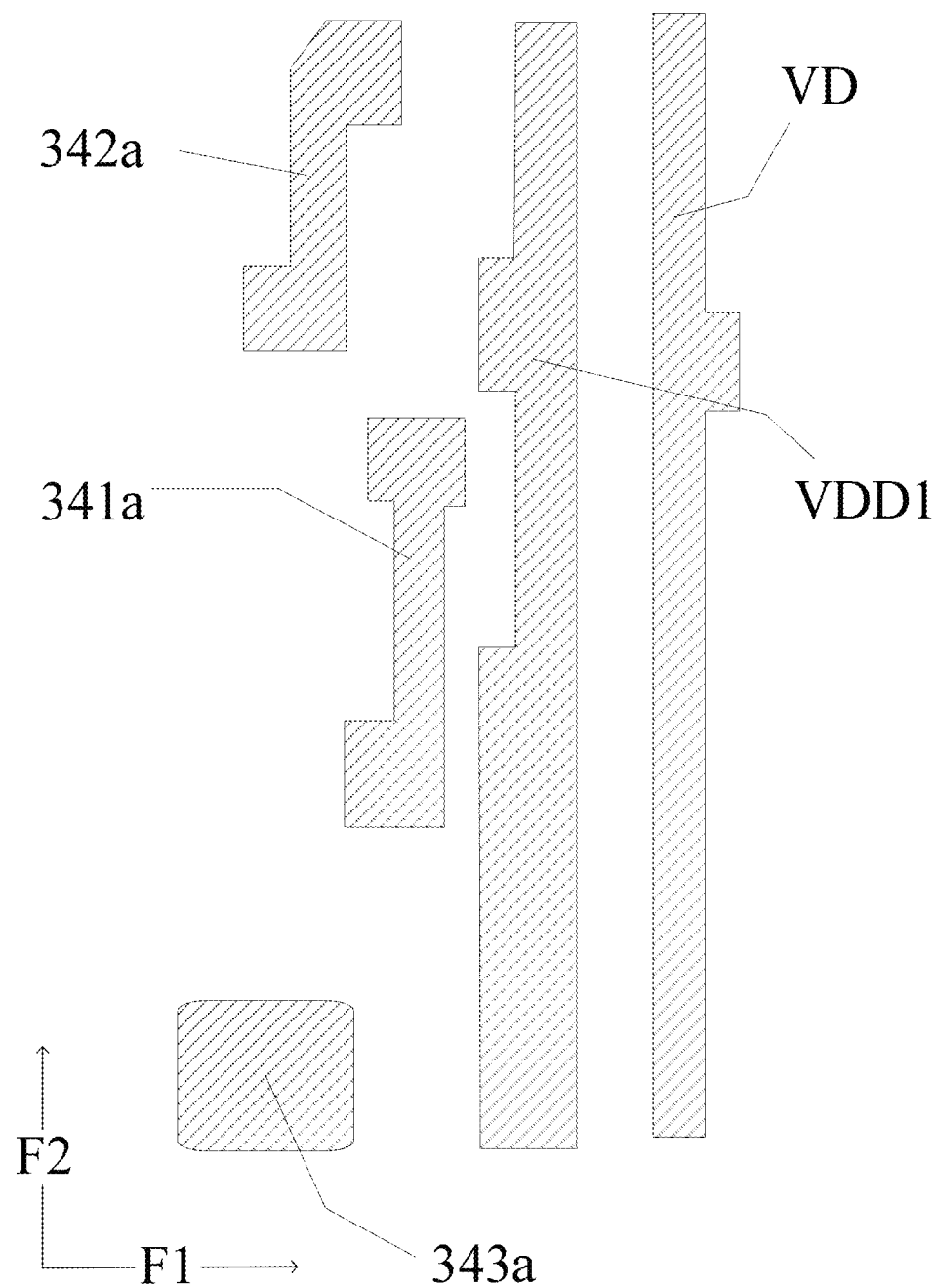
FIG. 4D is a schematic diagram of the layout structure of some first conductive layers provided by some embodiments of the disclosure.

In some embodiments, as shown in FIG. 5, a second gate insulating layer 620 is formed on the gate conductive layer 300 for protecting the gate conductive layer 300. As shown in FIGS. 3, 4C and 5, a capacitor electrode layer 400 of the pixel driving circuit 0121 is shown. The capacitor electrode layer 400 is disposed on the side, facing away from the base substrate 1000, of the second gate insulating layer 620. The capacitor electrode layer 400 may include a first electrode CC1a of the storage capacitor CST, a reset signal line VINIT, and a voltage stabilizing part 410. In some embodiments, an orthographic projection of the first electrode CC1a of the storage capacitor CST on the base substrate 1000 and an orthographic projection of a second electrode CC2a of the storage capacitor CST on the base substrate 1000 at least partially overlap to form the storage capacitor CST. There is an overlapping area between an orthographic projection of the voltage stabilizing part 410 on the base substrate 1000 and an orthographic projection of a source region of the active layer of the data writing transistor T2 on the base substrate 1000. There is an overlapping area between the positive projection of the voltage stabilizing part 410 on the base substrate 1000 and a positive projection of a drain region of the active layer of the first reset transistor T6 on the base substrate 1000. In addition, there is an overlapping area between the orthographic projection of the voltage stabilizing part 410 on the base substrate 1000 and an orthographic projection of a conductor area between the channel areas T31-A and T32-A of the adjacent threshold compensation transistor T3 on the base substrate 1000, so as to reduce the leakage current caused by photoelectric effect.

In some embodiments, as shown in FIG. 5, an interlayer dielectric layer 630 is formed on the capacitor electrode layer 400 for protecting the capacitor electrode layer 400. As shown in FIGS. 3, 4D and 5, a first conductive layer 100 of the pixel driving circuit 0121 is shown, and the first conductive layer 100 is disposed on the side, facing away from the base substrate 1000, of the interlayer dielectric layer 630. The first conductive layer 100 may include a data line VD, a power line VDD1, and bridging portions 341a, 342a, and 343a. The data line VD and the power line VDD1 are arranged in a spaced manner.

FIG. 5 is a cross-sectional structural schematic diagram in the AA' direction of the schematic diagram of the layout structure in FIG. 3. The first gate insulating layer 610 is disposed between the semiconductor layer 500 and the gate conductive layer 300, the second gate insulating layer 620 is disposed between the gate conductive layer 300 and the capacitor electrode layer 400, the interlayer dielectric layer 630 is disposed between the capacitor electrode layer 400 and the first conductive layer 100, and an interlayer insulating layer 640 is disposed on the side, facing away from the base substrate 1000, of the first conductive layer 100. Further, a planarization layer 650 is disposed on the side, facing away from the base substrate 1000, of the interlayer insulating layer 640, and a first electrode layer 600 is disposed on the side, facing away from the base substrate 1000, of the planarization layer 650. On the side, facing away from the base substrate 1000, of the first electrode layer 600, a pixel defining layer 660, a light-emitting functional layer 0122 and a second electrode layer 0123 are sequentially disposed. The first electrode layer 600 may include a plurality of first light-emitting electrodes arranged in a spaced manner, and the first light-emitting electrodes are electrically connected to the bridging portion 343a through via holes penetrating through the planarization layer 650 and the interlayer insulating layer 640. It should be noted that the first light-emitting electrodes, the light-emitting functional layer 0122 and the second electrode layer 0123 can form the above light-emitting device.

As shown in FIGS. 3 and 5, the sub-pixel spx may include a first connecting through hole, a second connecting through hole, a third connecting through hole and a fourth connecting through hole. The first connecting through hole penetrates through the first gate insulating layer 610, the second gate insulating layer 620 and the interlayer dielectric layer 630. The second connecting through hole penetrates through the second gate insulating layer 620 and the interlayer dielectric layer 630. The third connecting through hole penetrates through the interlayer dielectric layer 630.

In some embodiments, the sub-pixel spx may include first connecting through holes 381a, 382a, 384a, 387a and 388a. The sub-pixel spx may include a second connecting through hole 385a. The sub-pixel spx may include third connecting through holes 386a and 3832a.

The data line VD is electrically connected to the source region T2-S of the data writing transistor T2 in the semiconductor layer 500 through at least one first connecting through hole 381a. The power line VDD1 is electrically connected to the source region of the corresponding first light emission control transistor T4 in the semiconductor layer 500 through at least one first connecting through hole 382a. One end of the bridging portion 341a is electrically connected to the drain region of the corresponding threshold compensation transistor T3 in the semiconductor layer 500 through at least one first connecting through hole 384a. The other end of the bridging portion 341a is electrically connected to the gate of the driving transistor T1 in the gate conductive layer 300 (i.e., the second electrode CC2a of the storage capacitor CST) through at least one second connecting through hole 385a. One end of the bridging portion 342a is electrically connected to the reset signal line VINIT through at least one third connecting through hole 386a, and the other end of the bridging portion 342a is electrically connected to the source region T6-S of the first reset transistor T6 in the semiconductor layer 500 through at least one first connecting through hole 387a. The bridging portion 343a is electrically connected to the drain region of the second light emission control transistor T5 in the semiconductor layer 500 through at least one first connecting through hole 388a. The power line VDD1 is electrically connected to the first electrode CC1a of the storage capacitor CST in the capacitor electrode layer 400 through at least one third connecting through hole 3832a.

In some embodiments, the first connecting through holes 381a, 382a, 384a, 387a and 388a in the sub-pixel may be one or two or more, respectively. This can be determined according to the requirements of the actual application environment, and is not limited here.

In some embodiments, one or two or more second connecting through holes 385a may be arranged in the sub-pixel. This can be determined according to the requirements of the actual application environment, and is not limited here.

In some embodiments, the third connecting through holes 386a and 3832a in the sub-pixel may be one or two or more, respectively. This can be determined according to the requirements of the actual application environment, and is not limited here.

For example, as shown in FIGS. 3 to 4D, in the second direction F2, the first scanning line GA1, the second scanning line GA2 and the reset signal line VINIT are all located on the first side of the gate of the driving transistor T1, and the light emission control line EM is located on the second side of the driving transistor T1.

It should be noted that the positional relationship between the transistors in each sub-pixel spx is not limited to what is shown in FIGS. 3 to 4D, and the positions of the transistors can be specifically set according to specific application requirements.

It should be noted that the first direction F1 may be the row direction of the sub-pixels, and the second direction F2 may be the column direction of the sub-pixels. Alternatively, the first direction F1 may be the column direction of the sub-pixels, and the second direction F2 may be the row direction of the sub-pixels. In practical applications, this can be determined according to the actual application requirements, which is not limited here. In below description, the first direction F1 is taken as the row direction of the sub-pixels and the second direction F2 is taken as the column direction of the sub-pixels.

Figure 6:
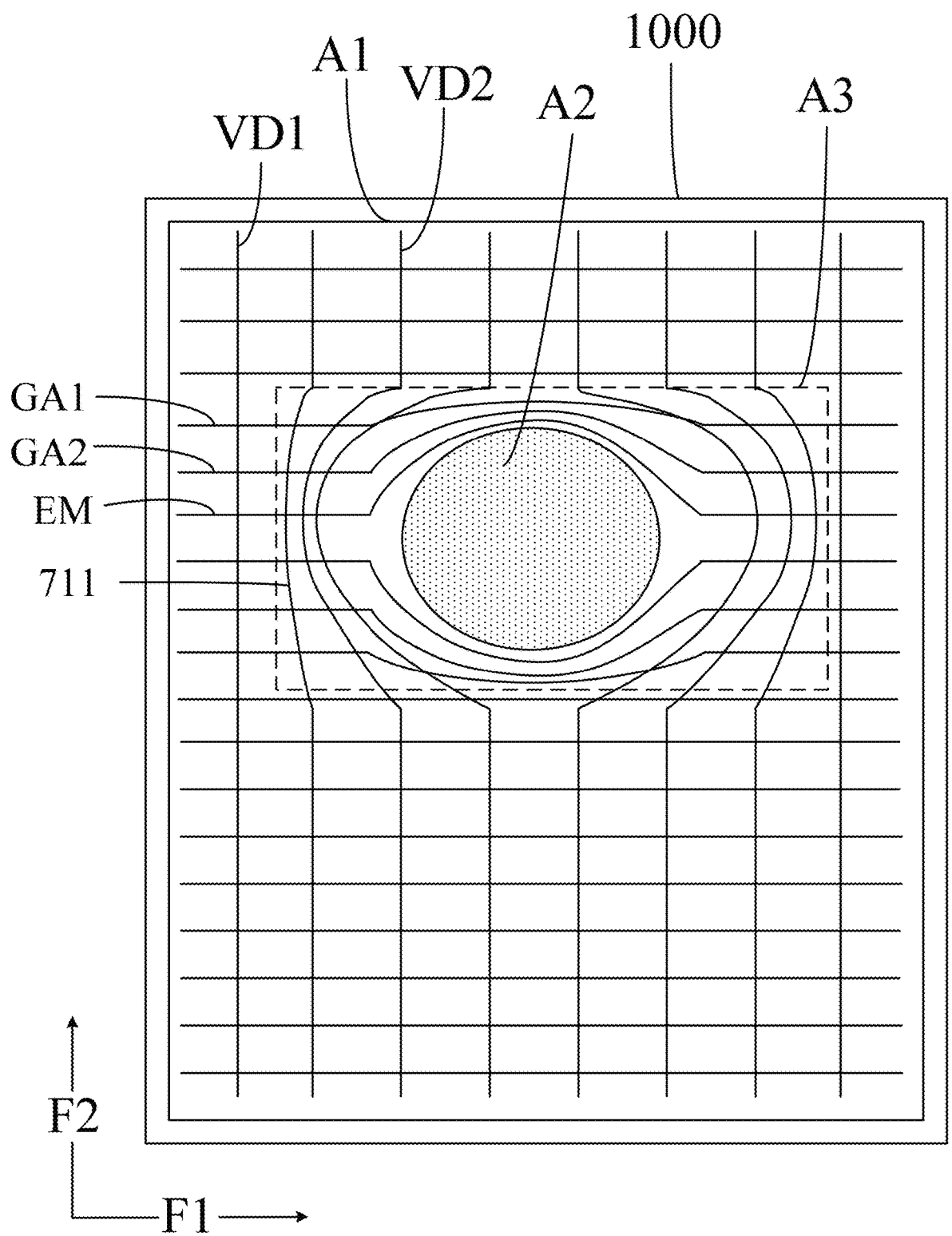
FIG. 6 is a structural schematic diagram of some other display panels provided by some embodiments of the disclosure.

In some embodiments of the disclosure, as shown in FIG. 6, the plurality of data lines in the first conductive layer 100 may include data lines VD1 and data lines VD2. The data lines VD1 and VD2 are both located in the display area A1, and the data lines VD1 and VD2 are both arranged in the first direction F1. Each data line VD1 extends from a lower side of the display area A1 to an upper side of the display area A1 in the second direction F2. Each data line VD2 extends in the second direction F2 and is divided by the notch area A2, that is, part of the data line VD2 may extend from the lower side of the display area A1 to the winding area A3, and the other part of the data line VD2 extends from the upper side of the display area A1 to the winding area A3.

In some embodiments of the disclosure, as shown in FIG. 6, the first conductive layer 100 may further include a plurality of data transmission lines 711 arranged at intervals. The plurality of data transmission lines 711 are located in the winding area A3. Each data line VD2 corresponds to one data transmission line 711. The two parts, divided by the notch area A2, of the same data line VD2 are electrically connected through the corresponding data transmission line 711. In addition, the first scanning line GA1, the second scanning line GA2 and the light emission control line EM corresponding to the notch area A2 also extend around the notch area A2 in the winding area A3. As a result, there are a large number of signal lines in the winding area A3, making it impossible to arrange the pixel driving circuit in the winding area A3. This leads to a decrease in the screen-to-body ratio of the display panel.

In some embodiments of the disclosure, as shown in FIG. 2A and FIGS. 7 to 9B, a plurality of pixel driving circuits 0121 are disposed on the base substrate 1000, and a plurality of light-emitting devices 0120 are located on the sides, facing away from the base substrate 1000, of the pixel driving circuits 0121. Each pixel driving circuit 0121 is electrically connected to one corresponding light-emitting device 0120. The plurality of pixel driving circuits 0121 are located in the display area A1. An orthographic projection of at least one of the plurality of light-emitting devices on the base substrate 1000 overlaps with the winding area A3, and the other light-emitting devices are located in the display area A1. Each light-emitting device whose orthographic projection on the base substrate 1000 overlaps with the winding area A3 is electrically connected to the corresponding pixel driving circuit 0121 through a first conducting line 311, and the first conducting line 311 extends from the display area A1 to the winding area A3.

According to some embodiments of the disclosure, the orthographic projection of at least one of the plurality of light-emitting devices on the base substrate 1000 overlaps with the winding area A3, and the other light-emitting devices are located in the display area A1; in this way, the light-emitting devices 0120 can be arranged on the winding area A3 in a direction perpendicular to the base substrate 1000, so that the display effect can be realized in the winding area A3.

In some embodiments of the disclosure, as shown in FIGS. 7 to 9B, there may be an overlapping area between an orthographic projection of a light-emitting area Q of the light-emitting device 0120 electrically connected to the pixel driving circuit 0121 near the winding area A3 on the base substrate 1000 and the winding area A3. In some embodiments, for the light-emitting devices whose orthographic projections on the base substrate 1000 overlap with the winding area A3, the orthographic projections of some of these light-emitting devices on the base substrate 1000 can be located in the winding area A3, and the orthographic projections of some of these light-emitting devices on the base substrate 1000 can partially overlap with the winding area A3. Of course, the number of the light-emitting devices whose orthographic projections on the base substrate 1000 are located in the winding area A3 and the number of the light-emitting devices whose orthographic projections on the base substrate 1000 partially overlap with the winding area A3 can be determined according to the requirements of practical applications, which is not limited here.

In some embodiments of the disclosure, as shown in FIGS. 7 to 9B, the display area may include a first area AH1, a second area AH2 and a third area AH3 arranged in the second direction F2. The second area AH2 includes a first sub-area AH2-1 and a second sub-area AH2-2 arranged in the first direction F1. The first sub-area AH2-1 and the second sub-area AH2-2 are separated by the notch area A2. In the direction perpendicular to the base substrate 1000, an orthographic projection of a light-emitting device whose orthographic projection on the base substrate 1000 overlaps with the winding area A3 in the second direction F2 may be located in at least one of the first sub-area AH2-1 and the second sub-area AH2-2.

In some embodiments, as shown in FIGS. 7 to 9B, in the first sub-area AH2-1, there may be an overlapping area between an orthographic projection of a light-emitting area Q of the light-emitting device electrically connected to the pixel driving circuit near the winding area on the base substrate 1000 and the winding area. For example, there may be an overlapping area between an orthographic projection of a light-emitting area Q of the light-emitting device electrically connected to the pixel driving circuit nearest to the winding area A3 on the base substrate 1000 and the winding area.

In some embodiments, as shown in FIGS. 7 to 9B, in the second sub-area AH2-2, there may be an overlapping area between an orthographic projection of a light-emitting area Q of the light-emitting device electrically connected to the pixel driving circuit near the winding area on the base substrate 1000 and the winding area. For example, there may be an overlapping area between an orthographic projection of a light-emitting area Q of the light-emitting device electrically connected to the pixel driving circuit adjacent to the winding area A3 on the base substrate 1000 and the winding area.

It should be noted that, as shown in FIG. 5, the pixel defining layer 660 has a plurality of openings, and each opening corresponds to one light-emitting device. Each opening can expose a first light-emitting electrode 610 of the corresponding light-emitting device, and the light-emitting functional layer 0122 is in contact with a region of the first light-emitting electrode 610 exposed by the opening, so that part of a region where the opening of the pixel defining layer 660 overlaps with a main body portion 410 of the first light-emitting electrode can be the light-emitting area Q of each light-emitting device.

In some embodiments of the disclosure, as shown in FIG. 5 and FIGS. 7 to 9B, the light-emitting devices in the first area AH1 and the third area AH3 are first light-emitting devices 0120-1, and regions defined by orthographic projections of light-emitting areas Q of the first light-emitting devices 0120-1 on the base substrate 1000 are approximately equal in area. Furthermore, the pixel driving circuits electrically connected to the first light-emitting devices 0120-1 are first pixel driving circuits 0121-1, that is, the pixel driving circuits in the first area AH1 and the third area AH3 are the first pixel driving circuits 0121-1, and regions defined by orthographic projections of the first pixel driving circuits 0121-1 on the base substrate 1000 are approximately equal in area. In some embodiments, the first pixel driving circuit 0121-1 may have a structure as shown in FIG. 2A, and the layout structure of the first pixel driving circuit 0121-1 may be the same as what is shown in FIG. 3. The first light-emitting electrode in the first light-emitting device 0120-1 may be electrically connected to the bridging portion 343a through a via hole 651a penetrating through the interlayer insulating layer 640 and the planarization layer 650, so that the first pixel driving circuit 0121-1 can drive the first light-emitting device 0120-1 electrically connected thereto to emit light. It should be noted that the region defined by the orthographic projection of the first pixel driving circuit 0121-1 on the base substrate 1000 refers to the region defined by an orthographic projection of a layout structure of the first pixel driving circuit 0121-1 in one sub-pixel on the base substrate 1000.

In some embodiments of the disclosure, as shown in FIG. 5 and FIGS. 7 to 9B, each light-emitting device whose orthographic projection on the base substrate 1000 overlaps with the winding area A3 is a second light-emitting device 0120-2, and the pixel driving circuits electrically connected to the second light-emitting devices 0120-2 are second pixel driving circuits 0121-2. In some embodiments, the area of regions defined by orthographic projections of the second pixel driving circuits 0121-2 on the base substrate 1000 may be approximately equal to the area of regions defined by orthographic projections of the first pixel driving circuits 0121-1 on the base substrate 1000. For example, the second pixel driving circuit 0121-2 may have a structure as shown in FIG. 2A, and the layout structure of the second pixel driving circuit 0121-2 may also be the same as what is shown in FIG. 3, so that the layout structure of the second pixel driving circuit 0121-2 and the layout structure of the first pixel driving circuit 0121-1 are approximately the same, and the size of the layout structure of the second pixel driving circuit 0121-2 and the size of the layout structure of the first pixel driving circuit 0121-1 are approximately the same. In this way, the layout structure of each film layer of the second pixel driving circuit 0121-2 and the first pixel driving circuit 0121-1 does not need to be changed, and the uniformity of the preparation process is improved.

In some embodiments of the disclosure, as shown in FIG. 5 and FIGS. 7 to 10, the second pixel driving circuits 0121-2 in the second area AH2 can be located in the same column as the first pixel driving circuits 0121-1 in the first area AH1 and the second area AH2. In some embodiments, the second pixel driving circuits 0121-2 and the first pixel driving circuits 0121-1 are arrayed on the base substrate 1000, wherein a column of pixel driving circuits is electrically connected to at least one data line correspondingly. For example, one data line VD1 is electrically connected to the first pixel driving circuits 0121-1 and the second pixel driving circuits 0121-2 in the same column.

In some embodiments of the disclosure, as shown in FIG. 5 and FIGS. 7 to 9B, the area of regions defined by orthographic projections of light-emitting areas Q of the second light-emitting devices 0120-2 on the base substrate 1000 can be made larger than the area of regions defined by orthographic projections of the light-emitting areas Q of the first light-emitting devices 0120-1 on the base substrate 1000. In this way, by enlarging the second light-emitting devices 0120-2 electrically connected to the second pixel driving circuits 0121-2 adjacent to the winding area, the light-emitting areas Q of part of the second light-emitting devices 0120-2 are arranged on the winding area, so that the display effect can be realized in the winding area.

In some embodiments of the disclosure, as shown in FIG. 5 and FIGS. 7 to 9B, the second pixel driving circuits 0121-2 can be located in the first sub-area AH2-1, so that for the second light-emitting devices 0120-2 electrically connected to the second pixel driving circuits 0121-2, the area of regions defined by orthographic projections of the light-emitting areas Q of the second light-emitting devices 0120-2 on the base substrate 1000 can be made larger than the area of regions defined by orthographic projections of the light-emitting areas Q of the first light-emitting devices 0120-1 on the base substrate 1000. In this way, by enlarging the second light-emitting devices 0120-2 electrically connected to the second pixel driving circuits 0121-2 adjacent to the winding area, the light-emitting areas Q of part of the second light-emitting devices 0120-2 are arranged on the winding area, so that the display effect can be realized in the winding area.

In some embodiments of the disclosure, as shown in FIGS. 7 to 9B, the second pixel driving circuits 0121-2 can also be located in the second sub-area AH2-2, so that for the second light-emitting devices 0120-2 electrically connected to the second pixel driving circuits 0121-2, the area of regions defined by orthographic projections of the light-emitting areas Q of the second light-emitting devices 0120-2 on the base substrate 1000 can be made larger than the area of regions defined by orthographic projections of the light-emitting areas Q of the first light-emitting devices 0120-1 on the base substrate 1000. In this way, by enlarging the second light-emitting devices 0120-2 electrically connected to the second pixel driving circuits 0121-2 adjacent to the winding area, the light-emitting areas Q of part of the second light-emitting devices 0120-2 are arranged on the winding area, so that the display effect can be realized in the winding area.

In some embodiments, as shown in FIGS. 7 to 9B, in the first direction and from the notch area to the first sub-area AH2-1 (i.e., the direction of arrow S1), the area of regions defined by orthographic projections of the light-emitting areas Q of the second light-emitting devices 0120-2 on the base substrate 1000 may decrease successively.

Figure 7:
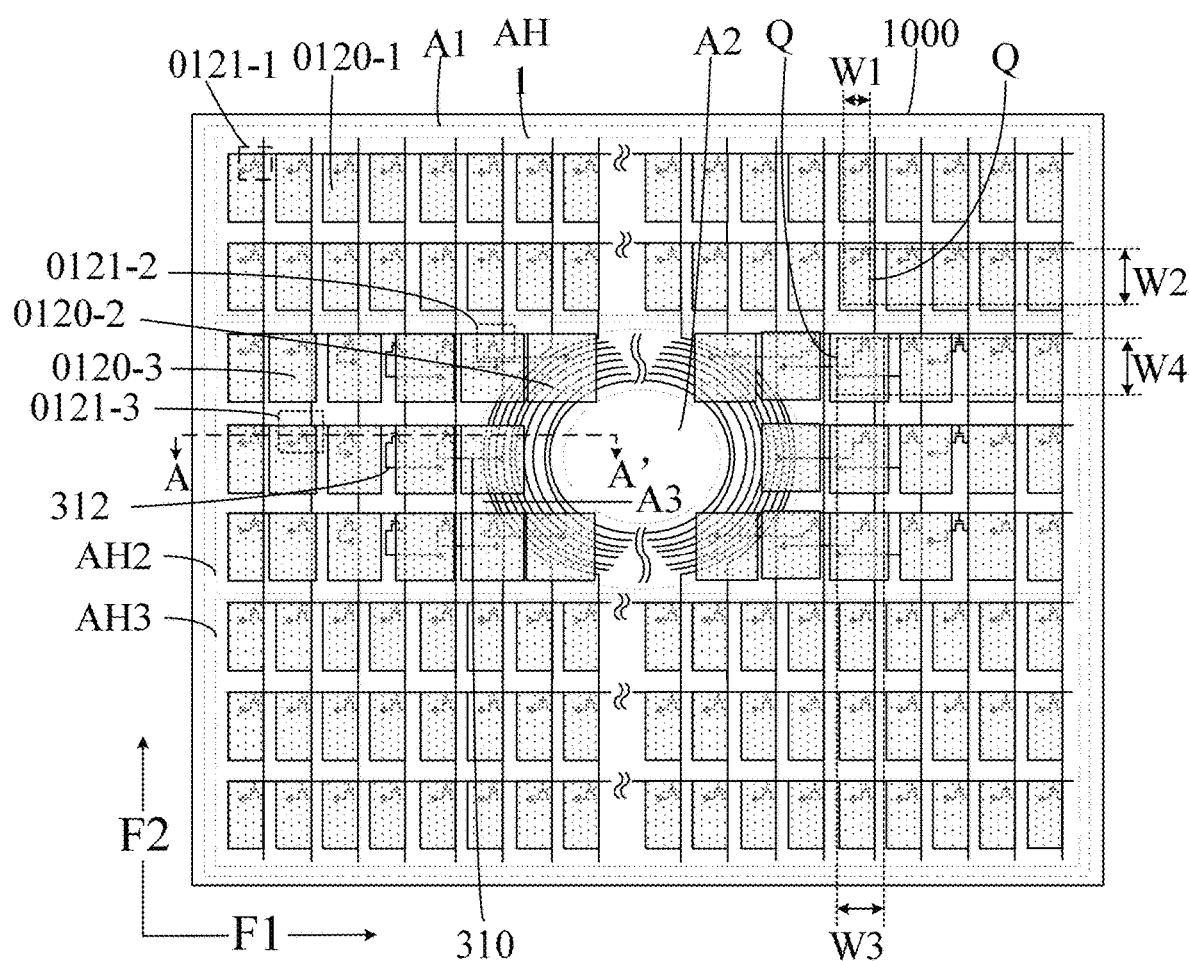
FIG. 7 is a specific structural schematic diagram of some other display panels provided by some embodiments of the disclosure.
Figure 8:
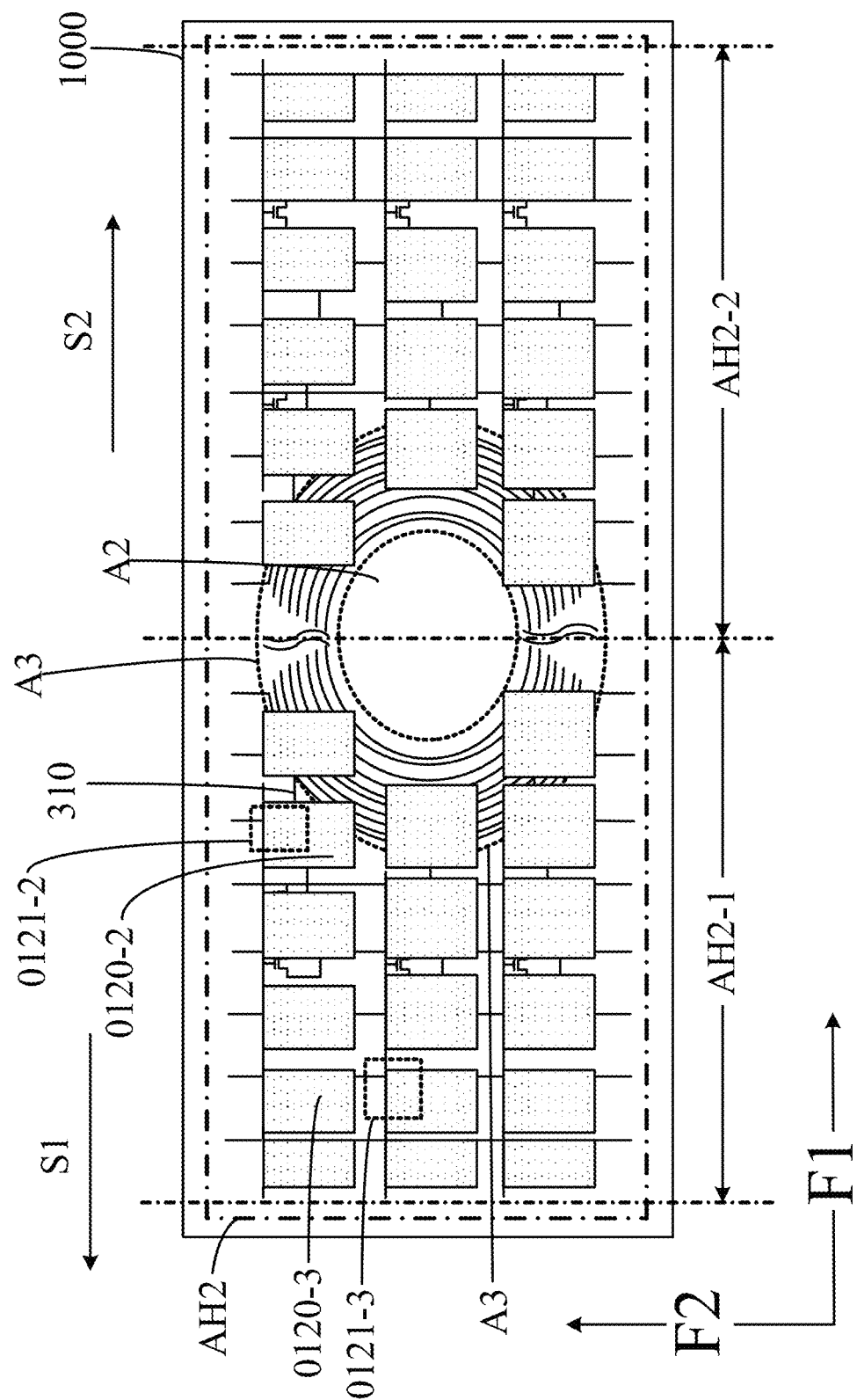
FIG. 8 is a specific structural schematic diagram of a second area of some display panels provided by some embodiments of the disclosure.

In some embodiments, as shown in FIGS. 7 and 8, in the first direction and from the notch area to the second sub-area AH2-2 (i.e., the direction of arrow S2), the area of regions defined by orthographic projections of the light-emitting areas Q of the second light-emitting devices 0120-2 on the base substrate 1000 may also decrease successively.

Figure 10:
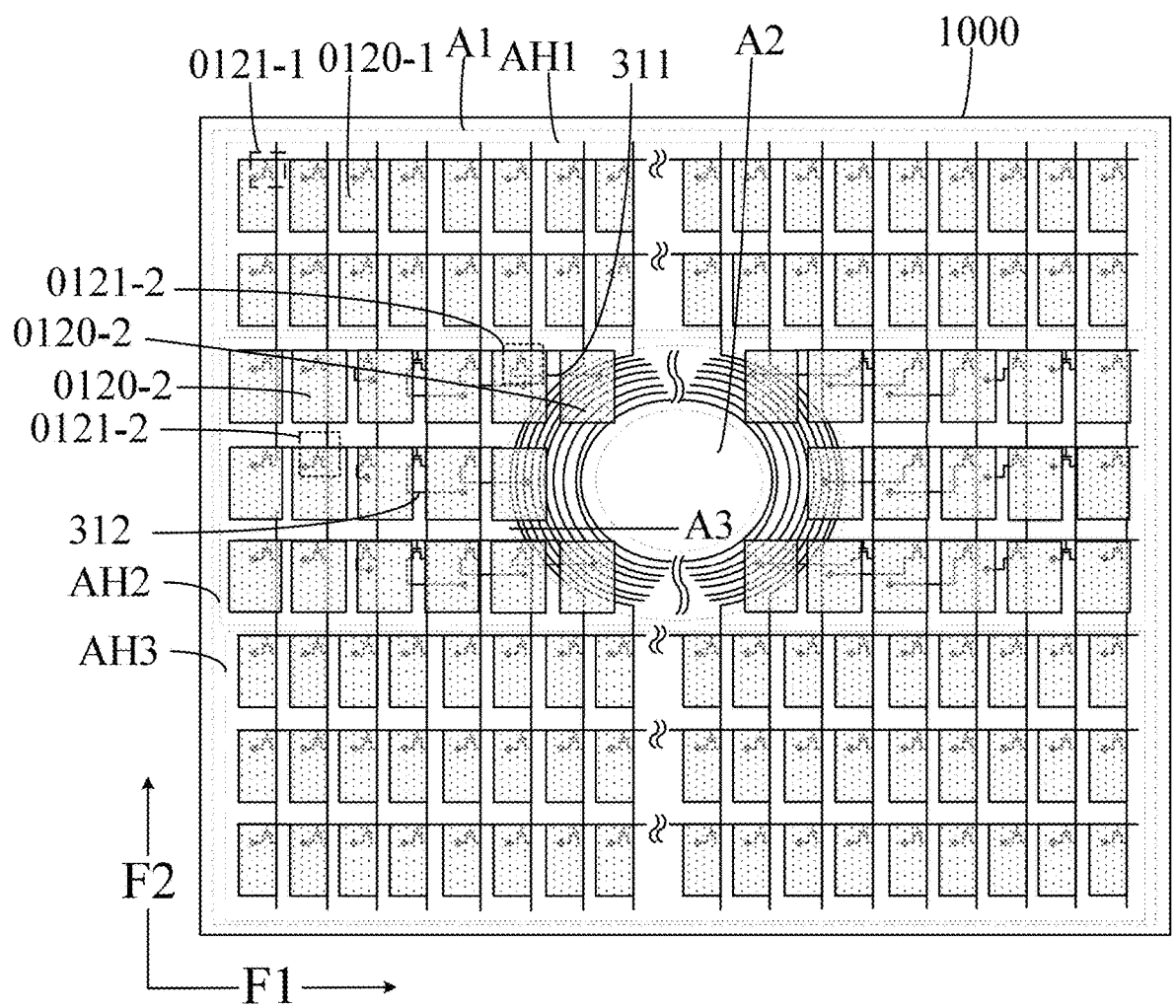
FIG. 10 is a specific structural schematic diagram of still other display panels provided by some embodiments of the disclosure.

In some embodiments of the disclosure, as shown in FIG. 10, the regions defined by orthographic projections of the light-emitting areas Q of the second light-emitting devices 0120-2 on the base substrate 1000 may also be approximately equal in area. In this way, the sizes of the openings of the pixel defining layer in the second area AH2 can be uniformly set.

In some embodiments of the disclosure, as shown in FIG. 7, the light-emitting devices located in the second area AH2 are third light-emitting devices 0120-3, and the pixel driving circuits electrically connected to the third light-emitting devices 0120-3 are third pixel driving circuits 0121-3. The area of regions defined by orthographic projections of the third pixel driving circuits 0121-3 on the base substrate 1000 may be approximately equal to the area of regions defined by orthographic projections of the first pixel driving circuits 0121-1 on the base substrate 1000. In some embodiments, the third pixel driving circuit 0121-3 may have a structure as shown in FIG. 2A, and the layout structure of the third pixel driving circuit 0121-3 may also be the same as what is shown in FIG. 3, so that the layout structure of the third pixel driving circuit 0121-3 and the layout structure of the first pixel driving circuit 0121-1 are approximately the same, and the size of the layout structure of the third pixel driving circuit 0121-3 and the size of the layout structure of the first pixel driving circuit 0121-1 are approximately the same. In this way, the layout structure of each film layer of the third pixel driving circuits 0121-3 and the first pixel driving circuits 0121-1 does not need to be changed, and the uniformity of the preparation process is improved.

In some embodiments of the disclosure, as shown in FIGS. 7 and 8, the area of regions defined by orthographic projections of light-emitting areas Q of the third light-emitting devices 0120-3 on the base substrate 1000 can be made smaller than the area of regions defined by orthographic projections of the light-emitting areas Q of the second light-emitting devices 0120-2 on the base substrate 1000. In some embodiments, in the first direction F1 and from the notch area A2 to the first sub-area AH2-1, the area of regions defined by orthographic projections of the light-emitting areas Q of the third light-emitting devices 0120-3 on the base substrate 1000 may decrease successively. In some embodiments, in the first direction F1 and from the notch area A2 to the first sub-area AH2-1, the area of regions defined by orthographic projections of the light-emitting areas Q of the third light-emitting devices 0120-3 on the base substrate 1000 may decrease successively.

In some embodiments of the disclosure, as shown in FIG. 10, the area of regions defined by orthographic projections of the light-emitting areas Q of the third light-emitting devices 0120-3 on the base substrate 1000 may be approximately equal to the area of regions defined by orthographic projections of the light-emitting areas Q of the second light-emitting devices 0120-2 on the base substrate 1000.

In some embodiments of the disclosure, as shown in FIGS. 7 to 10, for at least one third light-emitting device 0120-3 adjacent to the second light-emitting devices 0120-2, the third light-emitting device 0120-3 is electrically connected to the corresponding third pixel driving circuit 0121-3 through a second conducting line 312. Since the third light-emitting devices 0120-3 overlap with the winding area A3 in the direction perpendicular to the base substrate 1000, the third light-emitting device 0120-3 adjacent to the second light-emitting device 0120-2 will deviate from the corresponding third pixel driving circuit 0121-3. By arranging the second conducting line 312, the third pixel driving circuit 0121-3 can be electrically connected to the corresponding third light-emitting device 0121-3.

It should be noted that only one transistor in the first pixel driving circuit 0121-1, the second pixel driving circuit 0121-2 and the third pixel driving circuit 0121-3 is shown in FIGS. 7, 8 and 10, but the specific structures of the first pixel driving circuit 0121-1, the second pixel driving circuit 0121-2 and the third pixel driving circuit 0121-3 may be the same as what is shown in FIG. 3, which will not be repeated here.

In some embodiments of the disclosure, as shown in FIG. 7, the orthographic projections of the light-emitting areas Q of the first light-emitting devices 0120-1 on the base substrate 1000 have first widths W1 in the first direction, and the orthographic projections of the light-emitting areas Q of the first light-emitting devices 0120-1 on the base substrate 1000 have second widths W2 in the second direction. The first widths W1 of the light-emitting areas Q of all the first light-emitting devices 0120-1 are approximately equal, and the second widths W2 of the light-emitting areas Q of all the first light-emitting devices 0120-1 are approximately equal.

In some embodiments of the disclosure, as shown in FIG. 7, the orthographic projections of the light-emitting areas Q of the second light-emitting devices 0120-2 on the base substrate 1000 have third widths W3 in the first direction, and the orthographic projections of the light-emitting areas Q of the second light-emitting devices 0120-2 on the base substrate 1000 have fourth widths W4 in the second direction. The third widths W3 may be larger than the first widths W1, and the second widths W2 may be approximately equal to the fourth widths W4. Of course, in practical applications, the specific values of the first widths W1, the second widths W2, the third widths W3 and the fourth widths W4 may be set according to the requirements of practical applications, which is not limited here.

In some embodiments of the disclosure, as shown in FIG. 5 and FIGS. 7 to 10, the first conducting lines 311 and the scanning lines may be arranged on the same layer and made of the same material. That is, the first conducting lines 311 are disposed in the gate conductive layer 300. Further, the first conducting lines 311 and the scanning lines are arranged at intervals. One second pixel driving circuit 0121-2 is electrically connected to the corresponding second light-emitting device 0120-2 through at least one first conducting line 311. In some embodiments, one second pixel driving circuit 0121-2 is electrically connected to the corresponding second light-emitting device 0120-2 through one first conducting line 311, so that the current generated by the second pixel driving circuit 0121-2 can be supplied to the second light-emitting device 0120-2 so as to drive the second light-emitting device 0120-2 to emit light.

A first end of the first conducting line 311 needs to be electrically connected to the bridging portion 343a in the corresponding second pixel driving circuit 0121-2 through a via holes penetrating through the second gate insulating layer 620 and the interlayer dielectric layer 630, and a second end of the first conducting line 311 is electrically connected to the first light-emitting electrode of the corresponding second light-emitting device 0120-2 through a via hole penetrating through the second gate insulating layer 620, the interlayer dielectric layer 630, the planarization layer 650 and the interlayer insulating layer 640.

In some embodiments of the disclosure, as shown in FIG. 5 and FIGS. 7 to 10, the second conducting lines 312 and the scanning lines may be arranged on the same layer and made of the same material. That is, the second conducting lines 312 are disposed in the gate conductive layer 300. Further, the second conducting lines 312 and the scanning lines are arranged at intervals. One third pixel driving circuit 0121-3 is electrically connected to the corresponding third light-emitting device 0120-3 through at least one second conducting line 312. In some embodiments, one third pixel driving circuit 0121-3 is electrically connected to the corresponding third light-emitting device 0120-3 through one second conducting line 312, so that the current generated by the third pixel driving circuit 0121-3 can be supplied to the third light-emitting device 0120-3 so as to drive the third light-emitting device 0120-3 to emit light.

A first end of the second conducting line 312 also needs to be electrically connected to the bridging portion 343a in the corresponding third pixel driving circuit 0121-3 through a via hole penetrating through the second gate insulating layer 620 and the interlayer dielectric layer 630, and a second end of the second conducting line 312 is electrically connected to the first light-emitting electrode of the corresponding third light-emitting device 0120-3 through a via hole penetrating through the second gate insulating layer 620, the interlayer dielectric layer 630, the planarization layer 650 and the interlayer insulating layer 640.

It should be noted that in the actual process, due to the limitation of process conditions or other factors, the equality mentioned in the above-mentioned features is not total equality, and certain deviation may exist. Therefore, the equality mentioned in the above-mentioned features belongs to the protection scope of this disclosure as long as it roughly meets the above-mentioned conditions. For example, the equality mentioned above may be equality with allowable errors.

Figure 9A:
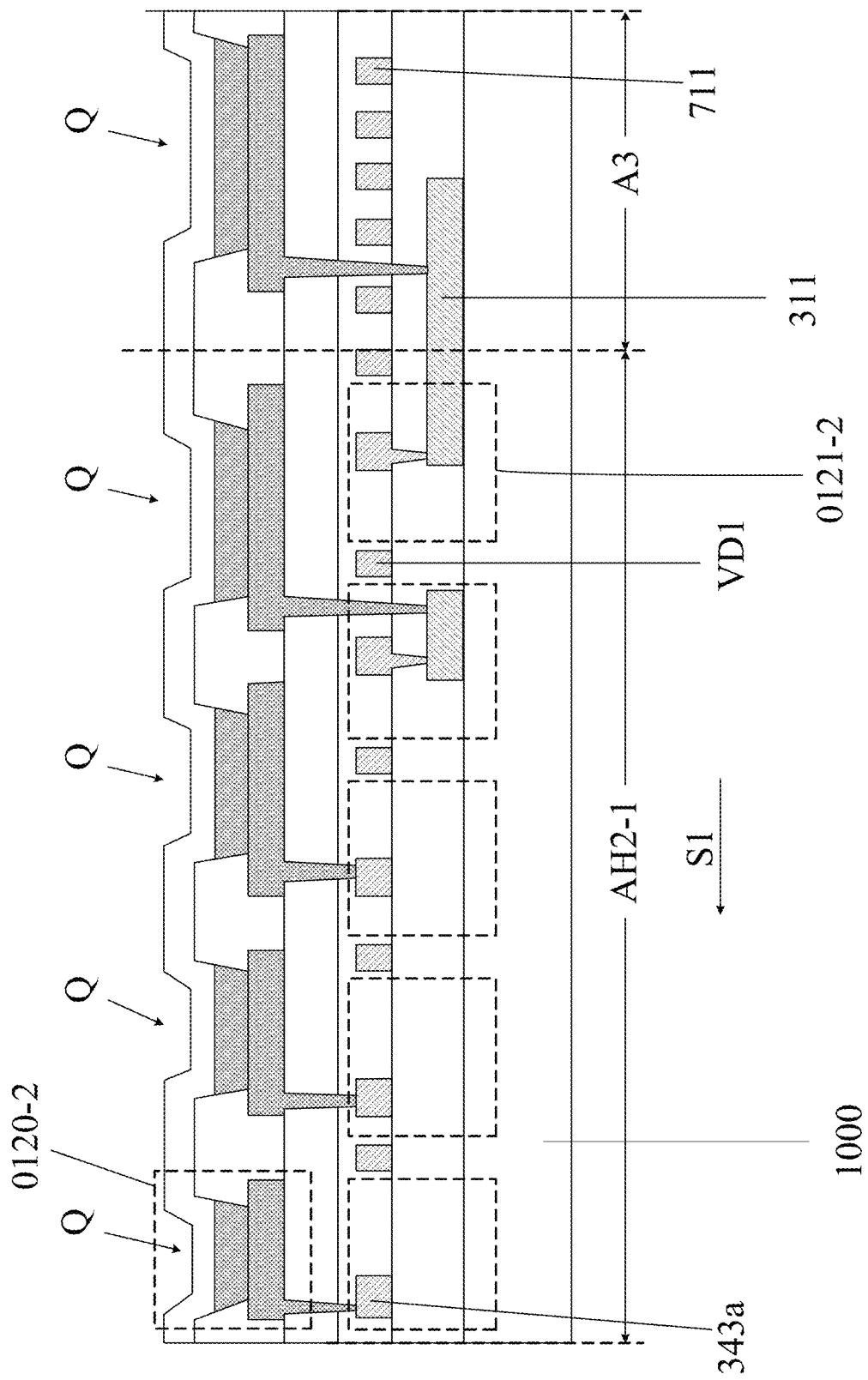
FIG. 9A is a partial sectional structural schematic diagram in the AA' direction of the specific structural schematic diagram shown in FIG. 7.
Figure 9B:
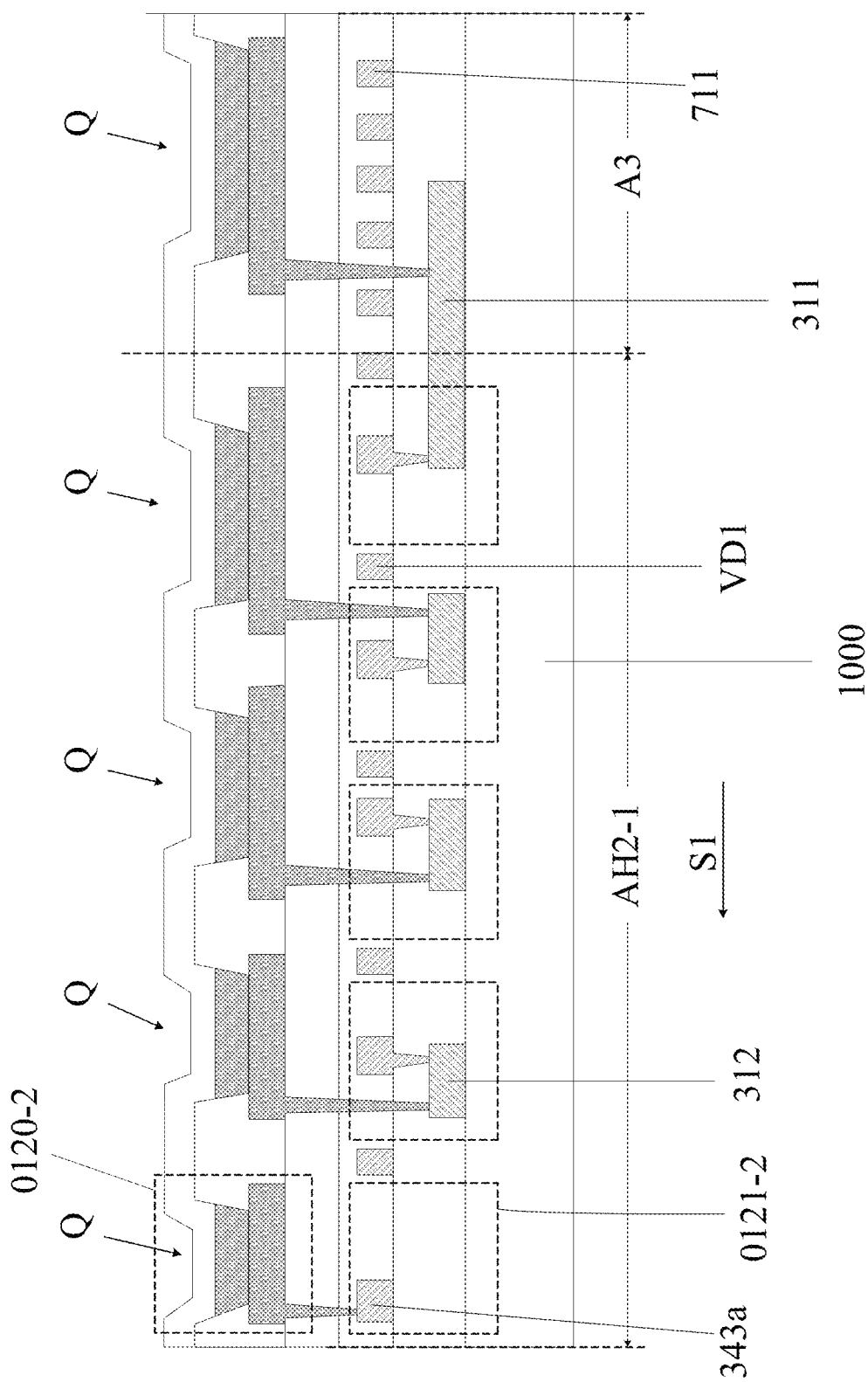
FIG. 9B is another partial sectional structural schematic diagram in the AA' direction of the specific structural schematic diagram shown in FIG. 7.

It should be noted that FIG. 9 only illustrates the data line, the data transmission line 711 and the bridging portion 343a in the first conductive layer, as well as the first conducting line 311 and second conducting line 312 in the gate conductive layer. One can refer to the contents shown in FIGS. 3 to 5 for other structures, which will not be described in detail here.

Figure 11:
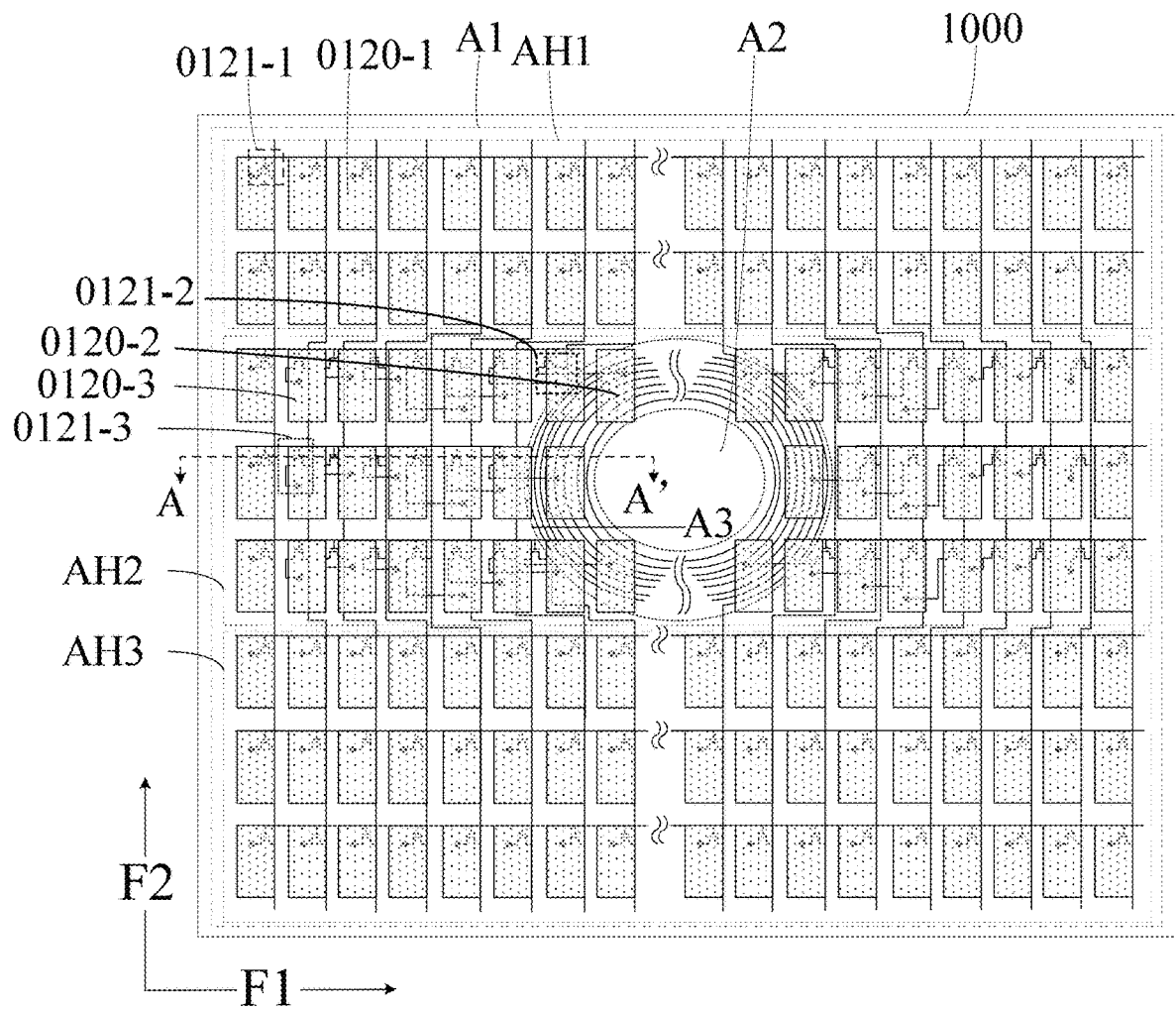
FIG. 11 is a specific structural schematic diagram of still other display panels provided by some embodiments of the disclosure.
Figure 12:
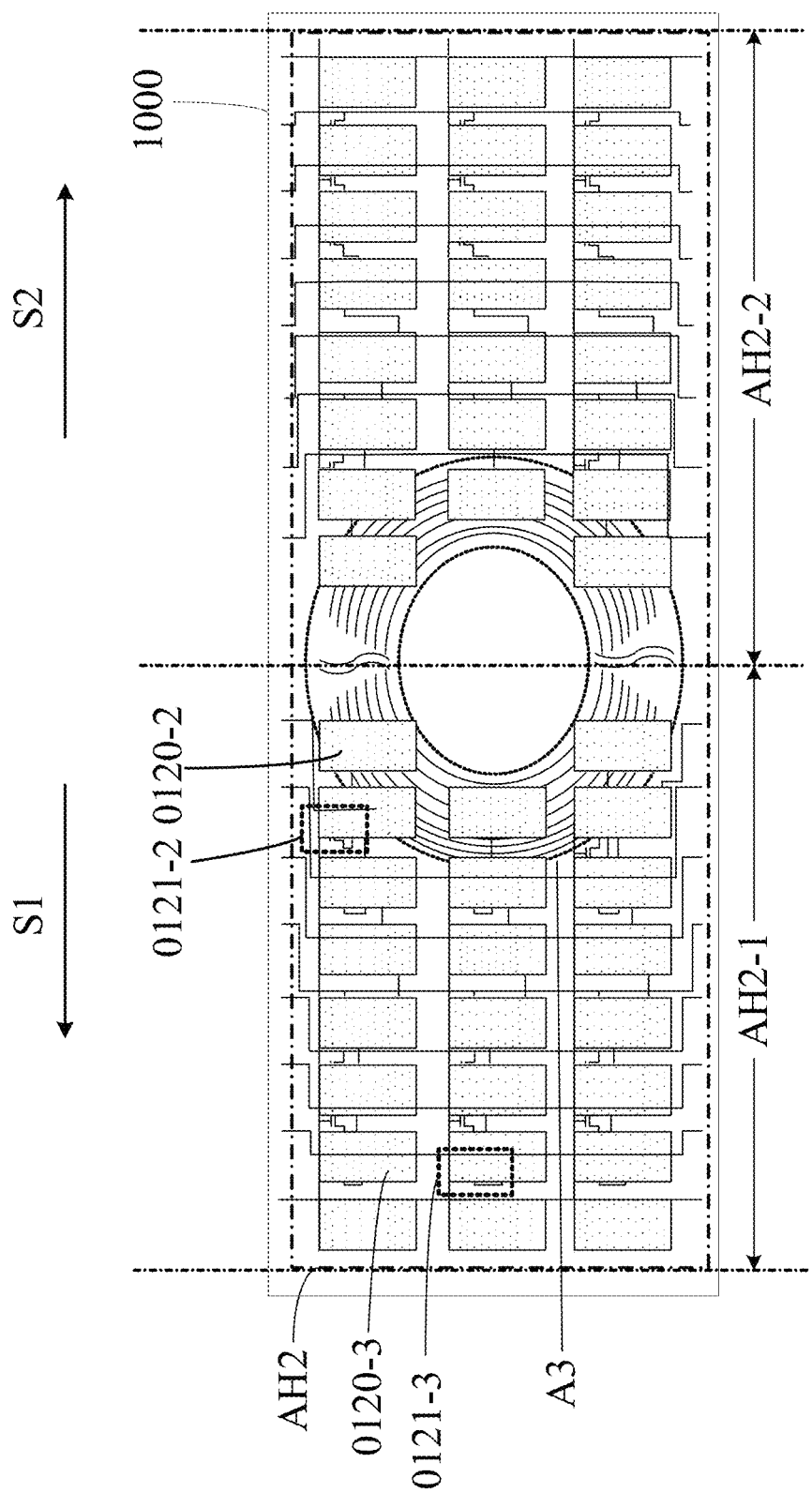
FIG. 12 is a specific structural schematic diagram of a second area of still other display panels provided by some embodiments of the disclosure.
Figure 13:
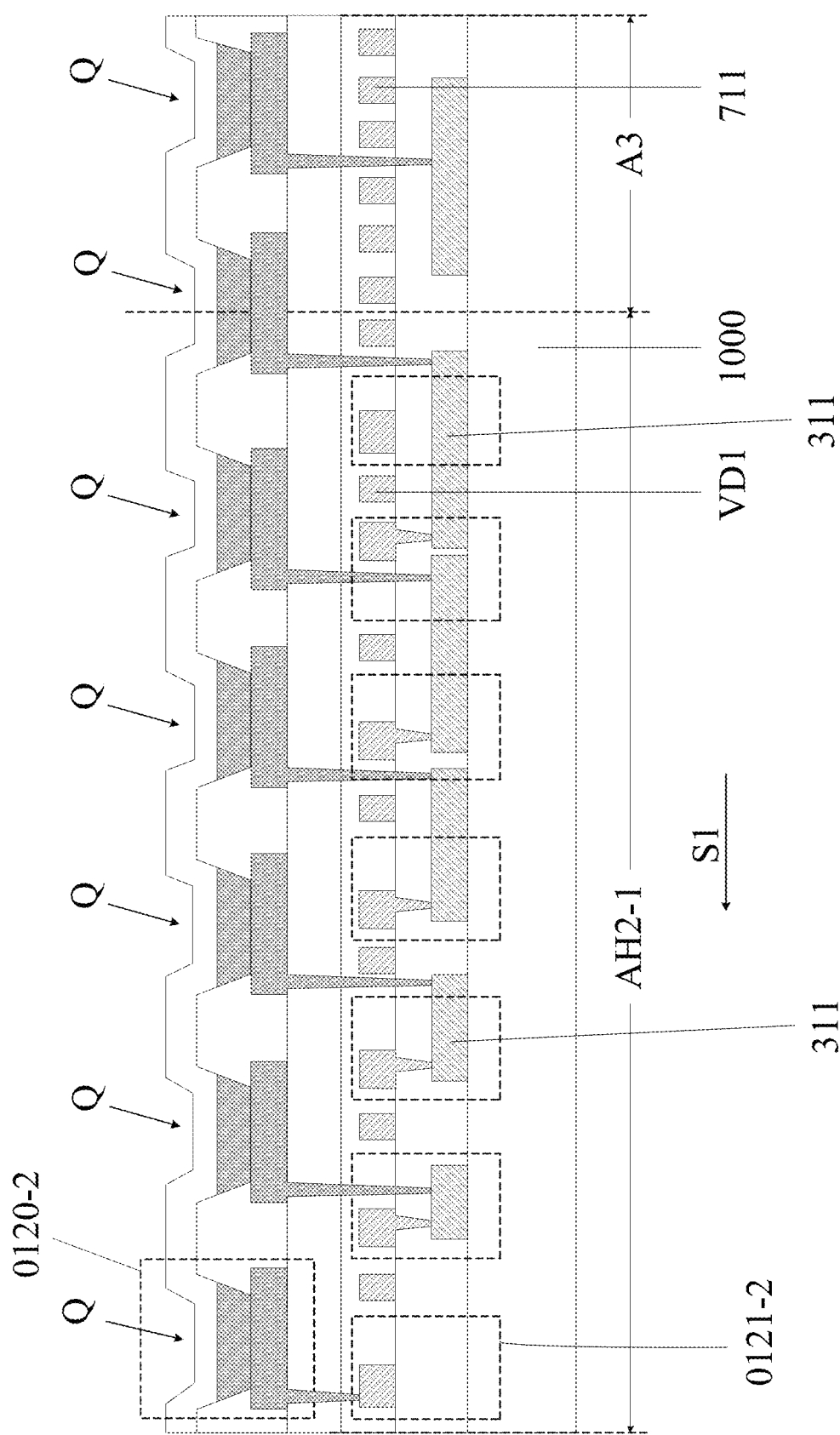
FIG. 13 is a partial sectional structural schematic diagram in the AA' direction of the specific structural schematic diagram shown in FIG. 11.

An embodiment of the disclosure provides some other display panels which are modifications of the above embodiments, the structural diagrams of which are shown in FIGS. 11 to 13. Only the differences between this embodiment and the above embodiments will be explained below, and the similarities will not be repeated here.

In some embodiments of the disclosure, as shown in FIGS. 11 to 13, each light-emitting device whose orthographic projection on the base substrate 1000 overlaps with the winding area A3 is a second light-emitting device 0120-2, and the pixel driving circuits electrically connected to the second light-emitting devices 0120-2 are second pixel driving circuits 0121-2. In some embodiments, the distribution density of the second pixel driving circuits 0121-2 is larger than that of the first pixel driving circuits 0121-1. In this way, more second pixel driving circuits 0121-2 can be arranged in the second area AH2. In some embodiments, the area of regions defined by orthographic projections of the light-emitting areas Q of the second light-emitting devices 0120-2 on the base substrate 1000 may be approximately equal to the area of regions defined by orthographic projections of the light-emitting areas Q of the first light-emitting devices 0120-1 on the base substrate 1000. In this way, the manufacturing processes of the first light-emitting devices 0120-1 and the second light-emitting devices 0120-2 can be the same.

In some embodiments of the disclosure, as shown in FIGS. 11 to 13, the second light-emitting devices 0120-2 in the second area AH2 may be located in the same column as the first light-emitting devices 0120-1 in the first area AH1 and the second area AH2. In this way, the first light-emitting devices 0120-1 and the second light-emitting devices 0120-2 can be arranged into an array.

In some embodiments of the disclosure, as shown in FIGS. 11 to 15, the pixel driving circuits electrically connected to a column of light-emitting devices can be electrically connected to at least one data line correspondingly. For example, the first pixel driving circuits 0121-1 corresponding to the first light-emitting devices 0120-1 and the second pixel driving circuits 0121-2 corresponding to the second light-emitting devices 0120-2 in the same column are electrically connected to one data line.

In some embodiments, as shown in FIGS. 11 to 13, the distribution density of the second pixel driving circuits 0121-2 in the first sub-area AH2-1 may be larger than that of the first pixel driving circuits 0121-1. The distribution density of the second pixel driving circuits 0121-2 adjacent to the winding area in the first sub-area AH2-1 may also be larger than that of the first pixel driving circuits 0121-1.

In some embodiments, as shown in FIGS. 11 to 13, the distribution density of the second pixel driving circuits 0121-2 in the second sub-area AH2-2 may be larger than that of the first pixel driving circuits 0121-1. The distribution density of the second pixel driving circuits 0121-2 adjacent to the winding area in the second sub-area AH2-2 may also be larger than that of the first pixel driving circuits 0121-1.

Figure 14:
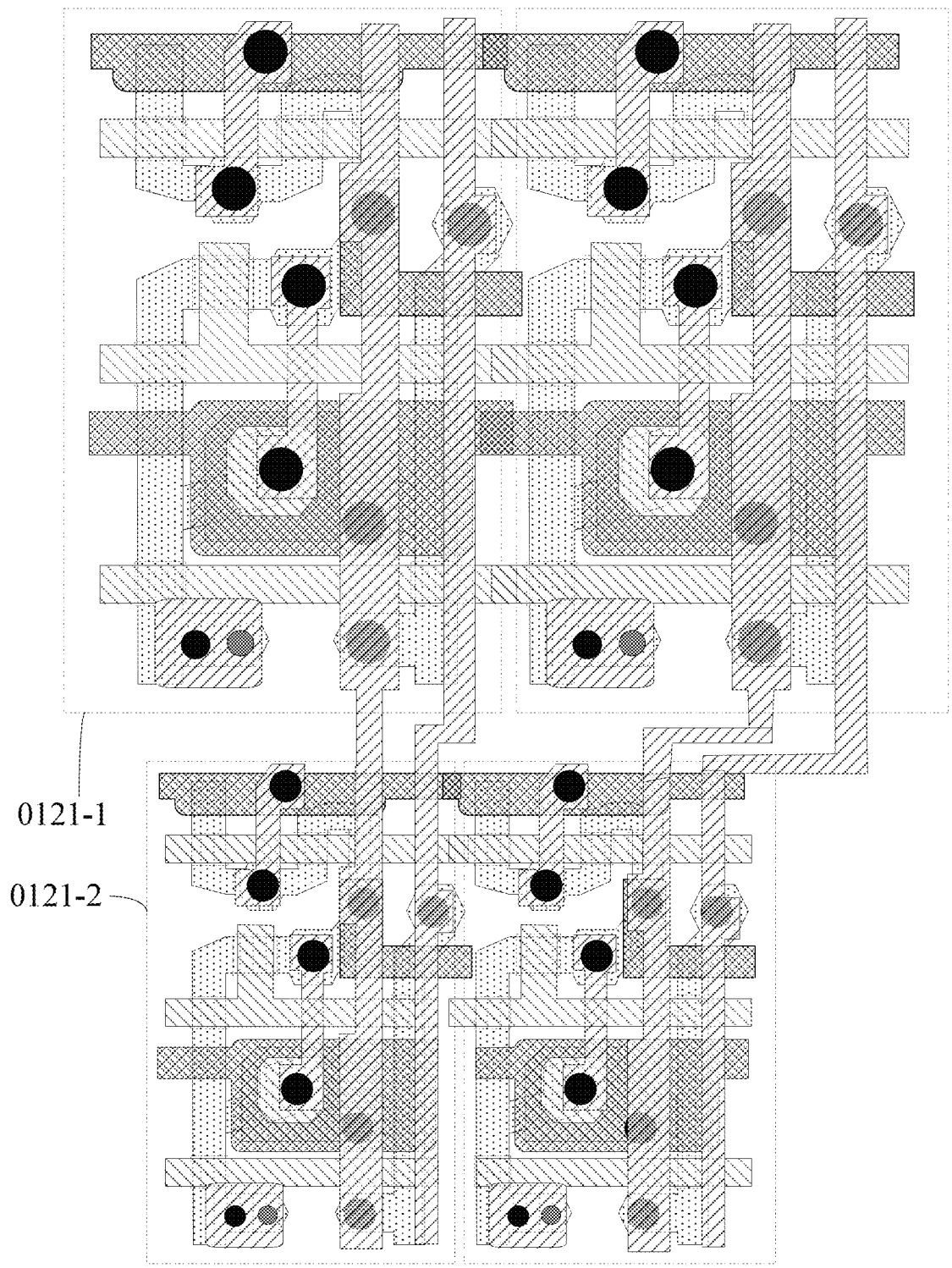
FIG. 14 is a specific structural schematic diagram of some further display panels provided by some embodiments of the disclosure.

In some embodiments, in at least one of the first sub-area AH2-1 and the second sub-area AH2-2, the area of regions defined by orthographic projections of the second pixel driving circuits 0121-2 on the base substrate 1000 is smaller than the area of regions defined by orthographic projections of the first pixel driving circuits 0121-1 on the base substrate 1000. In some embodiments, as shown in FIG. 14, the area of regions defined by orthographic projections of the second pixel driving circuits 0121-2 on the base substrate 1000 is smaller than the area of regions defined by orthographic projections of the first pixel driving circuits 0121-1 on the base substrate 1000. That is, the area occupied by the second pixel driving circuits 0121-2 on the base substrate 1000 can be reduced, so that more second pixel driving circuits 0121-2 can be arranged in one row.

In some embodiments of the disclosure, as shown in FIGS. 11 to 14, the area of regions defined by orthographic projections of the second pixel driving circuits 0121-2 on the base substrate 1000 can be approximately equal. In this way, the preparation process can be unified.

Figure 15:
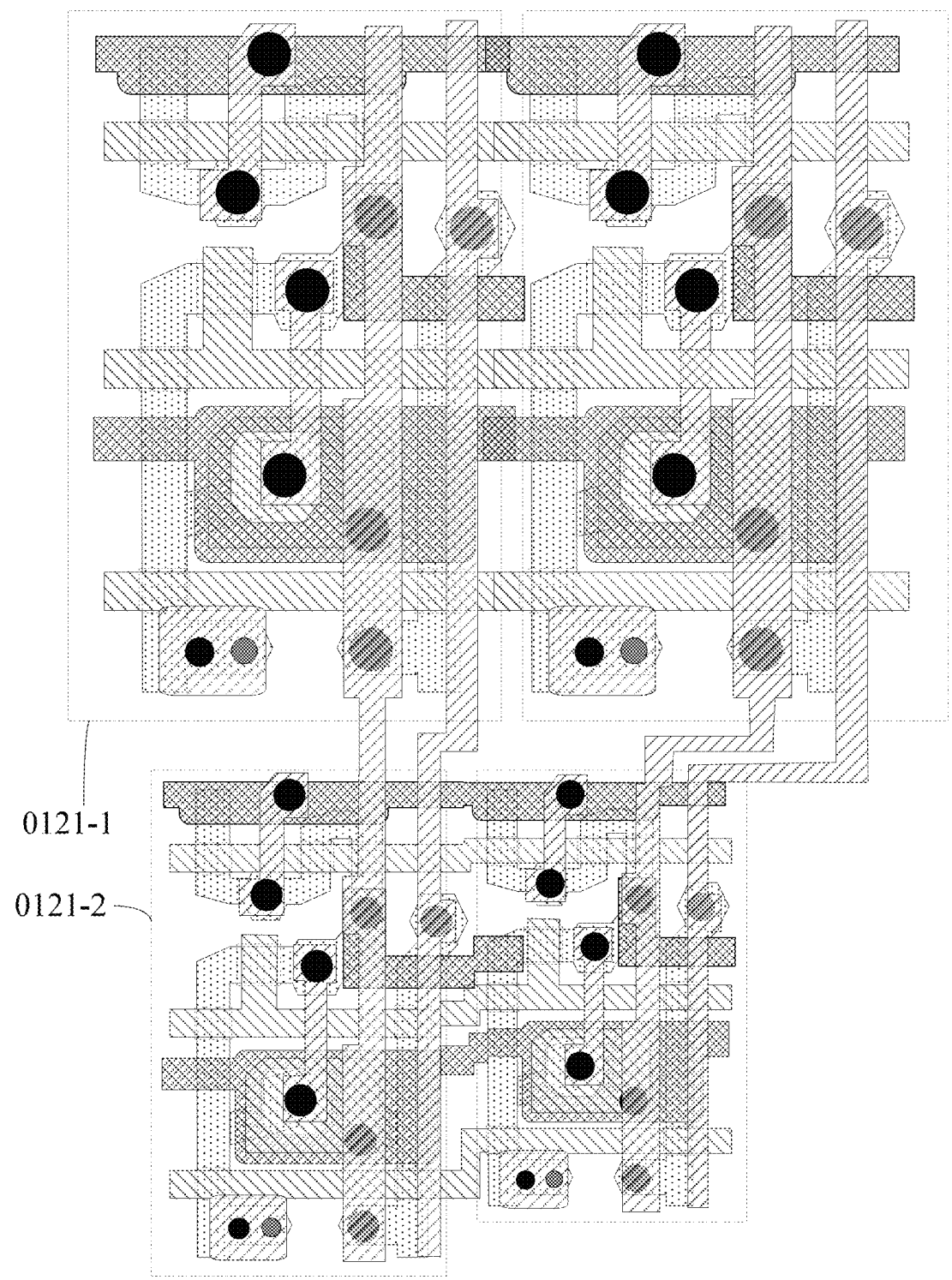
FIG. 15 is a specific structural schematic diagram of some further display panels provided by some embodiments of the disclosure.

In some embodiments of the disclosure, as shown in FIG. 15, in the first direction and from the notch area to the first sub-area AH2-1 (i.e., the direction of arrow S1), the area of regions defined by orthographic projections of the second pixel driving circuits 0121-2 on the base substrate 1000 may increase successively. Similarly, in the first direction and from the notch area to the second sub-area AH2-2, the area of regions defined by orthographic projections of the second pixel driving circuits 0121-2 on the base substrate 1000 may also increase successively. This implementation mode may be substantially the same as that in FIG. 15, and will not be repeated here.

In some embodiments of the disclosure, the transistors and storage capacitors in the first pixel driving circuits 0121-1 may be the same as the transistors and storage capacitors in the second pixel driving circuits 0121-2, and the area occupied by the second pixel driving circuits 0121-2 can be reduced when the second pixel driving circuits 0121-2 are prepared.

In some embodiments of the disclosure, the number of transistors in the second pixel driving circuit 0121-2 may also be smaller than the number of transistors in the first pixel driving circuit 0121-1. This can also reduce the area occupied by the second pixel driving circuits 0121-2. For example, the first reset transistor and the second reset transistor in FIG. 2A can be deleted to form the second pixel driving circuit 0121-2, so as to reduce the area occupied by the second pixel driving circuit 0121-2. Alternatively, a 2T1C pixel circuit may be used as the second pixel driving circuit 0121-2 to reduce the area occupied by the second pixel driving circuits 0121-2. In practical applications, this can be determined according to the requirements of practical applications, which is not limited here.

In some embodiments of the disclosure, as shown in FIGS. 11 to 15, the light-emitting devices located in the second area AH2 are third light-emitting devices 0120-3, and the pixel driving circuits electrically connected to the third light-emitting devices 0120-3 are third pixel driving circuits 0121-3. Orthographic projections of light-emitting areas Q of the third light-emitting devices 0120-3 on the base substrate 1000 are approximately equal to the orthographic projections of the light-emitting areas Q of the first light-emitting devices 0120-1 on the base substrate 1000. In this way, the orthographic projections of the light-emitting areas Q of the third light-emitting devices 0120-3 on the base substrate 1000, the orthographic projections of the light-emitting areas Q of the second light-emitting devices 0120-2 on the base substrate 1000, and the orthographic projections of the light-emitting areas Q of the first light-emitting devices 0120-1 on the base substrate 1000 can be approximately equal.

In some embodiments of the disclosure, as shown in FIGS. 11 to 15, in the first direction and from the notch area to the first sub-area AH2-1 (i.e., the direction of arrow S1), the area of regions defined by orthographic projections of the third pixel driving circuits 0121-3 on the base substrate 1000 may decrease successively.

In some embodiments of the disclosure, as shown in FIGS. 11 to 15, in the first direction and from the notch area to the second sub-area AH2-2 (i.e., the direction of arrow S2), the area of regions defined by orthographic projections of the third pixel driving circuits 0121-3 on the base substrate 1000 may decrease successively.

It should be noted that FIG. 13 only illustrates the data line, the data transmission line 711 and the bridging portion 343a in the first conductive layer, as well as the first conducting line 311 and second conducting line 312 in the gate conductive layer. One can refer to the contents shown in FIGS. 3 to 5 for other structures, which will not be described in detail here.

It should be noted that the above figures are only schematic illustrations of the display panel provided by some embodiments of the disclosure, and do not represent the specific structure of the display panel in actual applications. The specific structure of the display panel can be practically constructed on the basis of satisfying the contents described in some embodiments of the disclosure, and will not be described in detail here.

Based on the same inventive concept, some embodiments of the disclosure also provide a display device, including the above display panel provided by some embodiments of the disclosure. The display device may be any product or component with a display function such as a mobile phone, a tablet computer, a television, a display, a notebook computer, a digital photo frame, and a navigator. Other essential components needing to be arranged on the display device should be understood by those of ordinary skill in the art, and are not described in detail herein, nor should they be taken as limitations to the disclosure. The implementation of the display device can be seen in the above embodiments of the display panel, and will not be repeated here.

Although the preferred embodiments of the disclosure have been described, those skilled in the art can make additional changes and modifications to these embodiments once they know the basic inventive concepts. Therefore, the appended claims are intended to be interpreted as including the preferred embodiment and all changes and modifications that fall within the scope of the disclosure.

Obviously, those skilled in the art can make various changes and variations to some embodiments of the disclosure without departing from the spirit and scope of some embodiments of the disclosure. Thus, the disclosure is also intended to include such modifications and variations if they fall within the scope of the claims of the disclosure and their equivalents.

What is claimed is:

1. A display panel, comprising:
   a display area;
   a winding area surrounded by the display area;
   a notch area surrounded by the winding area;
   a plurality of pixel driving circuits located in the display area; and
   a plurality of light-emitting devices located at sides, facing away from a base substrate, of the pixel driving circuits, the plurality of pixel driving circuits are electrically connected to the plurality of light-emitting devices in an one-to-one manner;

wherein an orthographic projection of at least one of the plurality of light-emitting devices on the base substrate overlaps with the winding area, and other light-emitting devices are located in the display area;

the light-emitting device whose orthographic projection on the base substrate overlaps with the winding area is electrically connected to a corresponding pixel driving circuit through a first conducting line, and the first conducting line extends from the display area to the winding area;

wherein the display area comprises a first area, a second area and a third area which are arranged in a second direction;

the second area comprises a first sub-area and a second sub-area which are arranged in a first direction; wherein the first sub-area and the second sub-area are separated by the notch area;

an orthographic projection of the light-emitting device whose orthographic projection on the base substrate overlaps with the winding area in the second direction is located in at least one of the first sub-area and the second sub-area;

wherein the light-emitting devices in the first area and the third area are first light-emitting devices, and regions defined by orthographic projections of light-emitting areas of the first light-emitting devices on the base substrate are approximately equal in area;

the pixel driving circuits electrically connected to the first light-emitting devices are first pixel driving circuits, and regions defined by orthographic projections of the first pixel driving circuits on the base substrate are approximately equal in area;

wherein the light-emitting device whose orthographic projection on the base substrate overlaps with the winding area is a second light-emitting device, and the pixel driving circuits electrically connected with the second light-emitting devices are second pixel driving circuits;

an area of regions defined by orthographic projections of light-emitting areas of the second light-emitting devices on the base substrate is larger than an area of regions defined by orthographic projections of the light-emitting areas of the first light-emitting devices on the base substrate;

wherein in the first direction and from the notch area to at least one of the first sub-area and the second sub-area, the area of regions defined by orthographic projections of the light-emitting areas of the second light-emitting devices on the base substrate decreases successively.

2. The display panel according to claim 1, wherein the regions defined by orthographic projections of the light-emitting areas of the second light-emitting devices on the base substrate are approximately equal in area.

3. The display panel according to claim 1, wherein an area of regions defined by orthographic projections of the second pixel driving circuits on the base substrate is approximately equal to an area of regions defined by orthographic projections of the first pixel driving circuits on the base substrate; wherein the second pixel driving circuits are located in a same column as the first pixel driving circuits in the first area and the second area.

4. The display panel according to claim 1, wherein orthographic projections of the light-emitting areas of the first light-emitting devices on the base substrate have first widths in the first direction, and orthographic projections of the light-emitting areas of the first light-emitting devices on the base substrate have second widths in the second direction;

orthographic projections of the light-emitting areas of the second light-emitting devices on the base substrate have third widths in the first direction, and orthographic projections of the light-emitting areas of the second light-emitting devices on the base substrate have fourth widths in the second direction;

the third widths are larger than the first widths, and the second widths are approximately equal to the fourth widths.

5. The display panel according to claim 1, wherein the light-emitting devices located in the second area are third light-emitting devices, and the pixel driving circuits electrically connected with the third light-emitting devices are third pixel driving circuits;

an area of regions defined by orthographic projections of the third pixel driving circuits on the base substrate is approximately equal to the area of regions defined by orthographic projections of the first pixel driving circuits on the base substrate.

6. The display panel according to claim 5, wherein the area of regions defined by orthographic projections of light-emitting areas of the third light-emitting devices on the base substrate is smaller than the area of regions defined by orthographic projections of the light-emitting areas of the second light-emitting devices on the base substrate;

in the first direction and from the notch area to at least one of the first sub-area and the second sub-area, the area of regions defined by orthographic projections of the light-emitting areas of the third light-emitting devices on the base substrate decreases successively.

7. The display panel according to claim 5, wherein the regions defined by orthographic projections of the light-emitting areas of the third light-emitting devices on the base substrate are approximately equal to the regions defined by orthographic projections of the light-emitting areas of the second light-emitting devices on the base substrate in area.

8. The display panel according to claim 5, wherein for at least one third light-emitting device adjacent to the second light-emitting devices, the at least one third light-emitting device is electrically connected to a corresponding third pixel driving circuit through a second conducting line;

the display panel further comprises a plurality of scanning lines; wherein a row of pixel driving circuits is electrically connected to at least one scanning line;

at least one of the first conducting line and the second conducting line are located on a layer same as a layer on which the scanning lines are, and at least one of the first conducting line and the second conducting line are arranged with and the scanning lines in a spaced manner, and at least one of the first conducting line and the second conducting line is made of a material same as a material of which the scanning lines are made.

9. The display panel according to claim 1, wherein the light-emitting devices whose orthographic projections on the base substrate overlap with the winding area are second light-emitting devices, and the pixel driving circuits electrically connected with the second light-emitting devices are second pixel driving circuits;

a distribution density of the second pixel driving circuits is larger than a distribution density of the first pixel driving circuits.

10. The display panel according to claim 9, wherein the area of regions defined by orthographic projections of the second pixel driving circuits on the base substrate is smaller than the area of regions defined by orthographic projections of the first pixel driving circuits on the base substrate.

11. The display panel according to claim 10, wherein in the first direction and from the notch area to at least one of the first sub-area and the second sub-area, the area of regions defined by orthographic projections of the second pixel driving circuits on the base substrate increases successively.

12. The display panel according to claim 10, wherein the regions defined by orthographic projections of the second pixel driving circuits on the base substrate are approximately equal in area.

13. The display panel according to claim 10, wherein a quantity of transistors in the second pixel driving circuit is smaller than a quantity of transistors in the first pixel driving circuit.

14. The display panel according to claim 9, wherein the regions defined by orthographic projections of the light-emitting areas of the second light-emitting devices on the base substrate and the regions defined by orthographic projections of the light-emitting areas of the first light-emitting devices on the base substrate are approximately equal in area;
  wherein the second light-emitting devices in the second area are located in a same column as the first light-emitting devices in the first area and the second area.

15. The display panel according to claim 9, wherein the light-emitting devices located in the second area are third light-emitting devices, and the pixel driving circuits electrically connected with the third light-emitting devices are third pixel driving circuits;
  orthographic projections of light-emitting areas of the third light-emitting devices on the base substrate are smaller than or approximately equal to orthographic projections of light-emitting areas of the first light-emitting devices on the base substrate.

16. The display panel according to claim 15, wherein in the first direction and from the notch area to at least one of the first sub-area and the second sub-area, the area of regions defined by orthographic projections of the third pixel driving circuits on the base substrate decreases successively.

* * * * *